US010153771B2

(12) United States Patent
Ryu et al.

(10) Patent No.: US 10,153,771 B2
(45) Date of Patent: Dec. 11, 2018

(54) NEGATIVE-LEVEL SHIFTING CIRCUIT AND A SOURCE DRIVER AND A DISPLAY DEVICE USING THE CIRCUIT

(71) Applicant: SAMSUNG ELECTRONICS CO., LTD., Suwon-si, Gyeonggi-Do (KR)

(72) Inventors: Seong-Young Ryu, Seoul (KR); Yong-Hoan Kim, Suwon-si (KR); Eun-Jeong Park, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/879,497

(22) Filed: Oct. 9, 2015

(65) Prior Publication Data

US 2016/0126956 A1    May 5, 2016

(30) Foreign Application Priority Data

Oct. 10, 2014    (KR) ........................ 10-2014-0136962

(51) Int. Cl.
     *H03L 5/00*        (2006.01)
     *H03K 19/0185*    (2006.01)
     *G09G 5/00*        (2006.01)

(52) U.S. Cl.
     CPC ..... *H03K 19/018507* (2013.01); *G09G 5/003* (2013.01); *G09G 2310/0289* (2013.01)

(58) Field of Classification Search
     CPC ........... H03K 3/356; H03K 19/018521; H03K 19/00315; H03K 17/102; H03K 3/012
     USPC ................. 327/306, 333; 326/61, 62, 80–81
     See application file for complete search history.

(56) References Cited

U.S. PATENT DOCUMENTS

| | | | |
|---|---|---|---|
| 6,060,904 A * | 5/2000 | Shimoda | .......... H03K 3/356113 326/115 |
| 7,224,200 B2 | 5/2007 | Kida et al. | |
| 7,508,368 B2 * | 3/2009 | Miyazaki | ............. G09G 3/3696 345/89 |
| 7,791,371 B2 | 9/2010 | Nakazono | |
| 7,812,637 B2 | 10/2010 | Matsumoto et al. | |
| 7,880,501 B2 * | 2/2011 | Han | ..................... G09G 3/3696 326/68 |

(Continued)

FOREIGN PATENT DOCUMENTS

| | | |
|---|---|---|
| JP | 11-308092 | 11/1999 |
| JP | 2010-103971 | 5/2010 |

(Continued)

*Primary Examiner* — Dinh T Le
(74) *Attorney, Agent, or Firm* — F. Chau & Associates, LLC

(57) ABSTRACT

A negative-level shifting circuit includes a first level shifter including an input circuit configured to receive a logic signal having a first voltage level and a load circuit configured to generate a first output signal having a second voltage level based on a voltage generated by the input circuit, and a second level shifter configured to receive the first output signal from the first level shifter and generate a second output signal having a third voltage level. The first level shifter further includes a shielding circuit connected between the input circuit and the load circuit and configured to separate an operating voltage region of the input circuit from an operating voltage region of the load circuit such that the input circuit operates in a positive voltage region and the load circuit operates in a negative voltage region.

17 Claims, 17 Drawing Sheets

(56) References Cited

U.S. PATENT DOCUMENTS

| | | | |
|---|---|---|---|
| 8,218,377 B2* | 7/2012 | Tandon | G11C 5/147 |
| | | | 327/333 |
| 9,024,674 B1* | 5/2015 | Kim | H03K 19/017509 |
| | | | 327/333 |
| 2012/0154014 A1 | 6/2012 | Nakashima | |
| 2012/0313685 A1 | 12/2012 | Kim et al. | |

FOREIGN PATENT DOCUMENTS

| | | |
|---|---|---|
| JP | 2012033987 | 2/2012 |
| JP | 2013-150219 | 8/2013 |
| JP | 2013-162311 | 8/2013 |
| WO | 9732399 | 9/1997 |

* cited by examiner

N+1-TH FRAME

NEGATIVE-LEVEL SHIFTING CIRCUIT AND A SOURCE DRIVER AND A DISPLAY DEVICE USING THE CIRCUIT

CROSS-REFERENCE TO RELATED APPLICATION

This application claims priority under 35 U.S.C. § 119 to Korean Patent Application No. 10-2014-0136962, filed on Oct. 10, 2014, in the Korean Intellectual Property Office, the disclosure of which is incorporated by reference herein in its entirety.

TECHNICAL FIELD

The inventive concept relates to a level shifter and a device using the same, and more particularly, to a negative-level shifting circuit and a source driver and a display device using the circuit.

DISCUSSION OF THE RELATED ART

A liquid crystal display (LCD), which is applied to a portable electronic device, such as a tablet personal computer (PC), a laptop PC, or a mobile device, may be designed to be small in size and have reduced power consumption.

SUMMARY

An exemplary embodiment of the inventive concept provides a negative-level shifting circuit configured to shift a positive output signal of a low-voltage logic circuit to a negative level using a medium-voltage-standard circuit device.

An exemplary embodiment of the inventive concept provides a source driver including a negative-level shifting circuit configured to shift a positive output signal of a low-voltage logic circuit to a negative level using a medium-voltage-standard circuit device.

An exemplary embodiment of the inventive concept provides a display device using a negative-level shifting circuit configured to shift a positive output signal of a low-voltage logic circuit to a negative level using a medium-voltage-standard circuit device.

According to an exemplary embodiment of the inventive concept, there is provided a negative-level shifting circuit including: a first level shifter including an input circuit configured to receive a logic signal having a first voltage level and a load circuit configured to generate a first output signal having a second voltage level based on a voltage generated by the input circuit, and a second level shifter configured to receive the first output signal from the first level shifter and generate a second output signal having a third voltage level. The first level shifter further includes a shielding circuit connected between the input circuit and the load circuit and configured to separate an operating voltage region of the input circuit from an operating voltage region of the load circuit such that the input circuit operates in a positive voltage region and the load circuit operates in a negative voltage region.

A negative first-power supply voltage may be applied to the first level shifter and the second level shifter.

A negative first-power supply voltage and a positive second-power supply voltage may be applied to the first level shifter.

A voltage of about 0V and a negative first-power supply voltage may be applied to the second level shifter.

The logic signal may have a voltage level of about 0V or a positive first voltage.

The positive first voltage may have the same level as the positive second-power supply voltage.

The first output signal may have the same level as or a lower level than a negative first-power supply voltage, which is applied to the first level shifter and the second level shifter, or may have a negative voltage level lower than a voltage of about 0V.

The second output signal may have a voltage level of about 0V or a negative second voltage.

The negative second voltage may have the same level as a negative first-power supply voltage that is applied to the first level shifter and the second level shifter.

The input circuit may include a first p-type metal-oxide-semiconductor (PMOS) transistor having a gate terminal connected to an input terminal to which the logic signal is applied, a source terminal to which a positive second-power supply voltage is applied, and a drain terminal connected to a first node, and a second PMOS transistor having a gate terminal connected to an inverted input terminal, a source terminal to which the positive second-power supply voltage is applied, and a drain terminal connected to a second node. Each of the first node and the second node may be connected to the shielding circuit.

The load circuit may include a first n-type MOS (NMOS) transistor having a gate terminal and a drain terminal connected to a third node and a source terminal connected to a fourth node, a second NMOS transistor having a gate terminal and a drain terminal connected to a fifth node and a source terminal connected to a sixth node, a third NMOS transistor having a gate terminal connected to the fifth node, a drain terminal connected to the fourth node, and a source terminal to which a negative first-power supply voltage is applied, and a fourth NMOS transistor having a gate terminal connected to the third node, a drain terminal connected to the sixth node, and a source terminal to which the negative first-power supply voltage is applied. Each of the third node and the fifth node is connected to the shielding circuit.

The shielding circuit may include a plurality of transistors connected in series between the input circuit and the load circuit. A voltage of about 0V may be applied to the gate terminal of each of the plurality of transistors.

The shielding circuit may include a third PMOS transistor having a gate terminal connected to a ground voltage, a source terminal connected to a first node, and a drain terminal connected to a seventh node, a fourth PMOS transistor having a gate terminal connected to the ground voltage, a source terminal connected to a second node, and a drain terminal connected to an eighth node, a fifth NMOS transistor having a gate terminal connected to the ground voltage, a drain terminal connected to the seventh node, and a source terminal connected to a third node, and a sixth NMOS transistor having a gate terminal connected to the ground voltage, a drain terminal connected to the eighth node, and a source terminal connected to a fifth node. Each of the first node and the second node may be connected to the input circuit, and each of the third node and the fifth node may be connected to the load circuit.

The input circuit may include a first PMOS transistor having a gate terminal connected to an input terminal to which the logic signal is applied, a source terminal to which a positive second-power supply voltage is applied, and a drain terminal connected to the first node, and a second PMOS transistor having a gate terminal connected to an inverted input terminal, a source terminal to which the positive second-power supply voltage is applied, and a drain terminal connected to the second node.

The load circuit may include a first NMOS transistor having a gate terminal and a drain terminal connected to the third node, and a source terminal connected to a fourth node, a second NMOS transistor having a gate terminal and a drain terminal connected to the fifth node and a source terminal connected to a sixth node, a third NMOS transistor having a gate terminal connected to the fifth node, a drain terminal connected to the fourth node, and a source terminal to which a negative first-power supply voltage is applied, and a fourth NMOS transistor having a gate terminal connected to the third node, a drain terminal connected to the sixth node, and a source terminal to which the negative first-power supply voltage is applied.

The second level shifter may include a fifth PMOS transistor having a gate terminal connected to an output terminal from which the second output signal is provided, a source terminal connected to a ground voltage, and a drain terminal connected to an inverted output terminal, a sixth PMOS transistor having a gate terminal connected to the inverted output terminal, a source terminal connected to the ground voltage, and a drain terminal connected to the output terminal, a seventh NMOS transistor having a gate terminal connected to a first output node of the first level shifter, a drain terminal connected to the inverted output terminal, and a source terminal connected to a negative first-power supply voltage, and an eighth NMOS transistor having a gate terminal connected to a second output node of the first level shifter, a drain terminal connected to the output terminal, and a source terminal connected to the negative first-power supply voltage.

Each of the first output node and the second node of the first level shifter may be connected to the load circuit.

The load circuit may include a first NMOS transistor having a gate terminal and a drain terminal connected to a third node and a source terminal connected to a fourth node, a second NMOS transistor having a gate terminal and a drain terminal connected to a fifth node and a source terminal connected to a sixth node, a third NMOS transistor having a gate terminal connected to the fifth node, a drain terminal connected to the fourth node, and a source terminal to which the negative first-power supply voltage is applied, and a fourth NMOS transistor having a gate terminal connected to the third node, a drain terminal connected to the sixth node, and a source terminal to which the negative first-power supply voltage is applied. The sixth node is the first output node of the first level shifter, and the fourth node is the second output node of the first level shifter.

The load circuit may include a first NMOS transistor having a gate terminal and a drain terminal connected to a third node and a source terminal connected to a fourth node, a second NMOS transistor having a gate terminal and a drain terminal connected to a fifth node and a source terminal connected to a sixth node, a third NMOS transistor having a gate terminal connected to the fifth node, a drain terminal connected to the fourth node, and a source terminal to which the negative first-power supply voltage is applied, and a fourth NMOS transistor having a gate terminal connected to the third node, a drain terminal connected to the sixth node, and a source terminal to which the negative first-power supply voltage is applied. The fifth node may be the first output node of the first level shifter, and the fourth node may be the second output node of the first level shifter.

According to an exemplary embodiment of the inventive concept, there is provided a source driver including: a data register circuit configured to store a digital image signal, a level shifting circuit configured to shift a voltage level of the digital image signal output by the data register circuit, a decoding circuit configured to generate an analog gradation voltage signal corresponding to the digital image signal which is level shifted, and an amplifier circuit configured to amplify the analog gradation voltage signal. The level shifting circuit includes a first level shifter including an input circuit configured to receive the digital image signal having a first voltage level and a load circuit configured to generate a first output signal having a second voltage level based on a voltage generated by the input circuit, and a second level shifter configured to receive the first output signal from the first level shifter and generate a second output signal having a third voltage level. The first level shifter may further include a shielding circuit connected between the input circuit and the load circuit and configured to separate an operating voltage region of the input circuit from an operating voltage region of the load circuit such that the input circuit operates in a positive voltage region and the load circuit operates in a negative voltage region.

A negative first-power supply voltage and a positive second-power supply voltage may be applied to the first level shifter, and a voltage of about 0V and the negative first-power supply voltage may be applied to the second level shifter.

The source driver may further include a multiplexer configured to change a data signal line to which a signal output by the amplifier circuit is applied, in response to a polarity control signal.

The level shifting circuit may further include a positive-level shifting circuit configured to boost a voltage level of the positive voltage region.

According to an exemplary embodiment of the inventive concept, there is provided a display device including: a display panel including gate lines, source lines, and a plurality of pixels disposed at intersections between the gate lines and the source lines, a gate driver configured to drive the gate lines, and a source driver configured to drive the source lines. The source driver includes a negative-level shifting circuit, which includes a first level shifter including an input circuit configured to receive a digital image signal having a first voltage level and a load circuit configured to generate a first output signal having a second voltage level based on a voltage generated by the input circuit, and a second level shifter configured to receive the first output signal from the first level shifter and generate a second output signal having a third voltage level. The first level shifter further includes a shielding circuit connected between the input circuit and the load circuit and configured to separate an operating voltage region of the input circuit from an operating voltage region of the load circuit such that the input circuit operates in a positive voltage region and the load circuit operates in a negative voltage region.

A negative first-power supply voltage and a positive second-power supply voltage may be applied to the first level shifter, and a voltage of about 0V and the negative first-power supply voltage may be applied to the second level shifter.

According to an exemplary embodiment of the inventive concept, there is provided a negative-level shifting circuit comprising: a first level shifter including an input circuit, a load circuit and a shielding circuit, the shielding circuit configured to separate an operating voltage region of the load circuit from the input circuit; and a second level shifter configured to receive a signal having a low voltage of about −5.5V to about −5.0V and a high voltage of about −1.0V to about −2.5V from the first level shifter, and output a signal having a low voltage of about −5.5V and a high voltage which is level shifted to about 0V.

A positive first-power supply voltage and a negative second-power supply voltage are applied to the first level shifter, and a voltage of about 0V and the negative second-power supply voltage are applied to the second level shifter.

The first level shifter receives a logical signal having a low voltage of about 0V and a high voltage of about 1.8V to output the signal having the low voltage of about −5.5V to about −5.0V and the high voltage of about −1.0V to about −2.5V to the second level shifter.

Transistors of the first level shifter meet medium-voltage standards.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
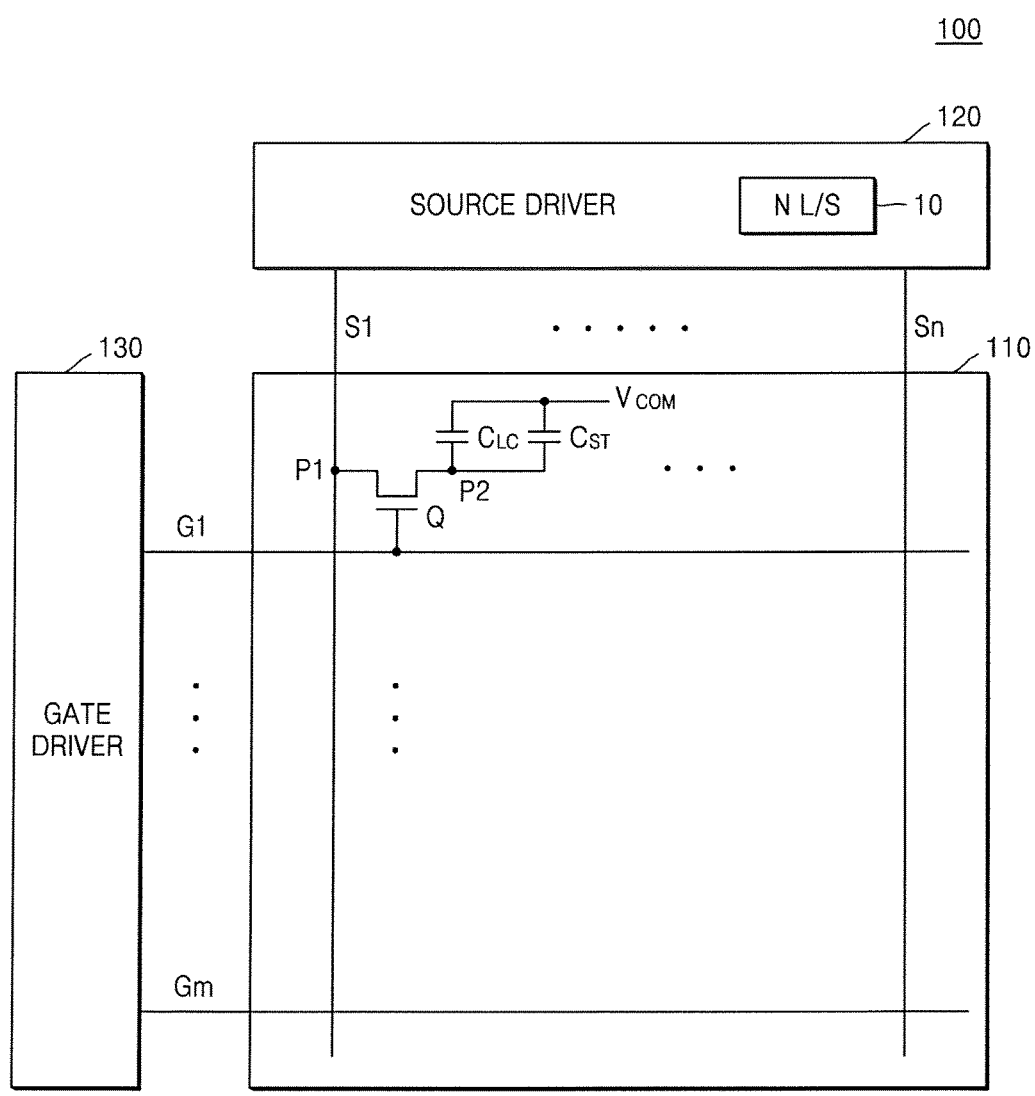
FIG. 1 is a diagram of a display device according to an exemplary embodiment of the inventive concept.

Exemplary embodiments of the inventive concept will now be described more fully hereinafter with reference to the accompanying drawings. It should be understood, however, that the inventive concept may be embodied in many different forms and should not be construed as being limited to the embodiments set forth herein. Like reference numerals may refer to like elements throughout this application. In the drawings, the thicknesses of layers and regions may be exaggerated for clarity.

FIG. 1 is a diagram of a display device 100 according to an exemplary embodiment of the inventive concept.

As shown in FIG. 1, the display device 100 may include a display panel 110, a source driver 120, and a gate driver 130.

The display panel 110 may be, for example, a liquid crystal display (LCD). The display panel 110 may include a plurality of pixels, each pixel being disposed at intersections between a plurality of gate lines G1 to Gm and a plurality of source lines S1 to Sn. As an example, each of the pixels may include a transistor Q connected to one of the gate lines G1 to Gm and one of the source lines S1 to Sn, and a liquid crystal (LC) capacitor $C_{LC}$ and a storage capacitor $C_{ST}$, which are connected between the transistor Q and a common power source VCOM. For example, a gate line may be connected to a gate terminal of the transistor Q included in each of the pixels, a source line may be connected to a first terminal P1 of the transistor Q, and the LC capacitor $C_{LC}$ and the storage capacitor $C_{ST}$ may be connected in parallel between a second terminal P2 of the transistor Q and the common power source VCOM. For example, the first terminal P1 of the transistor Q may be a source terminal, and the second terminal P2 of the transistor Q may be a drain terminal.

For example, in a ZERO-VCOM driving method, the common power source VCOM may be set to 0V. As another example, in an HAVDD-VCOM driving method, the common power source VCOM may be set to AVDD/2. Here, AVDD is an analog driving voltage.

The source driver 120 may receive image data to be displayed using pixels of one row, and transmit a gradation voltage corresponding to the received image data to columns of the source lines S1 to Sn. The source lines S1 to Sn may be referred to as data lines.

The source driver 120 may include a negative-level shifting circuit (NL/S; 10). The negative-level shifting circuit 10 may use medium-voltage (e.g., 5.5V)-standard transistors. In other words, the negative-level shifting circuit 10 may use the medium-voltage-standard transistors without using high-voltage (e.g., about 10V or higher)-standard transistors. For example, a middle voltage may be less than about 6V.

For example, the negative-level shifting circuit 10 may include a two-stage level shifter. In addition, the negative-level shifting circuit 10 may be configured to form a shielding region using a medium-voltage-standard transistor such that a voltage equal to or higher than a middle voltage is not applied to transistors constituting a level shifter of a first stage. Furthermore, from among output signals of the level shifter of the first stage, a medium-voltage signal may be applied to a level shifter of a second stage. Thus, the level shifters of the two stages may be embodied by using medium-voltage-standard transistors. In addition, a single negative power supply voltage and a single positive power supply voltage may be applied to the negative-level shifting circuit 10. Therefore, it may be unnecessary to apply an additional power supply voltage.

As another example, the negative-level shifting circuit 10 may include level shifters of three stages using two negative power supply voltages and a single positive power supply voltage. In addition, the level shifters of the three stages may be embodied using medium-voltage-standard transistors.

The gate driver 130 may sequentially activate the gate lines G1 to Gm of the display panel 110.

Figure 2A:
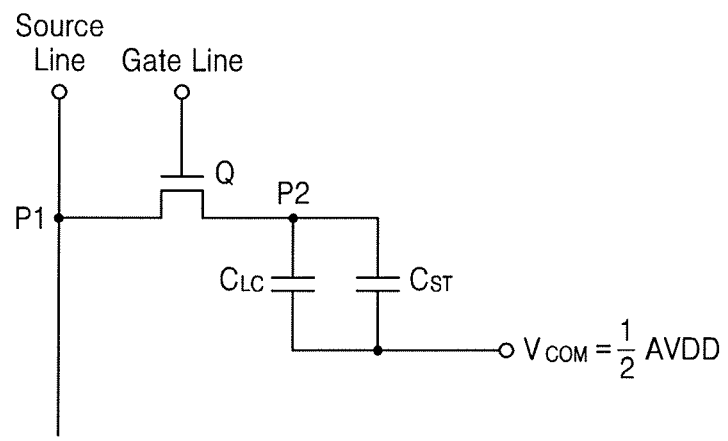
FIG. 2A is a diagram of a voltage applied to a pixel when a display panel shown in FIG. 1 is driven using an HAVDD-VCOM driving method, according to an exemplary embodiment of the inventive concept.

FIG. 2A is a diagram of a voltage applied to a pixel when the display panel 110 shown in FIG. 1 is driven using an HAVDD-VCOM driving method, according to an exemplary embodiment of the inventive concept.

As shown in FIG. 2A, a source line may be connected to a first terminal P1 of a transistor Q, and an LC capacitor CLC and a storage capacitor CST may be connected in parallel between a second terminal P2 of the transistor Q and a common power source VCOM. In addition, a voltage corresponding to ½ an analog driving voltage AVDD may be applied to a terminal of the common power source VCOM.

For example, when the analog driving voltage AVDD is about 11V, a voltage of about 5.5 V may be applied to the terminal of the common power source VCOM. In this case, a voltage of the second terminal P2 of the transistor Q may range from about 5.5V to about 11V during a positive driving operation, and range from about 0V to about 5.5V during a negative driving operation.

Figure 2B:
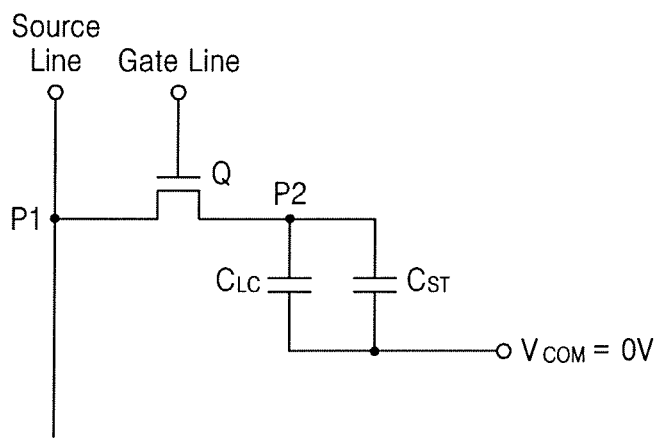
FIG. 2B is a diagram of a voltage applied to a pixel when the display panel shown in FIG. 1 is driven using a ZERO-VCOM driving method, according to an exemplary embodiment of the inventive concept.

FIG. 2B is a diagram of a voltage applied to a pixel when the display panel 110 shown in FIG. 1 is driven using a ZERO-VCOM driving method, according to an exemplary embodiment of the inventive concept.

As shown in FIG. 2B, a source line may be connected to a first terminal P1 of a transistor Q, and an LC capacitor CLC and a storage capacitor CST may be connected in parallel between a second terminal P2 of the transistor Q and a common power source VCOM. In addition, a voltage of about 0V may be applied to a terminal of the common power source VCOM.

For example, when an analog driving voltage AVDD is about 11V, a voltage of the second terminal P2 of the transistor Q may range from about 0V to about 5.5V during a positive driving operation, and range from about −5.5V to about 0V during a negative driving operation Referring back to FIG. 1, when an electric field having a single polarity is applied to the pixels of the display panel 110 for a large amount of time, image persistence may occur due to parasitic charges caused by deterioration of a liquid crystal (LC) material or impurities.

To prevent deterioration of the pixels, the polarity of each of the pixels may be inverted in each frame. In this case, flicker may occur due to a minute difference in luminance between polarities. As methods for reducing the occurrence of the flicker, a row inversion driving method, a column inversion driving method, and a dot inversion driving method may be employed. The row inversion driving method may be applied to invert the polarity of pixels in adjacent gate lines, and the column inversion driving method may be applied to invert the polarity of pixels in adjacent source lines. The dot inversion driving method, which is a mixture of the row inversion driving method and the column inversion driving method, may be applied to invert the polarities of adjacent pixels.

Figure 3A:
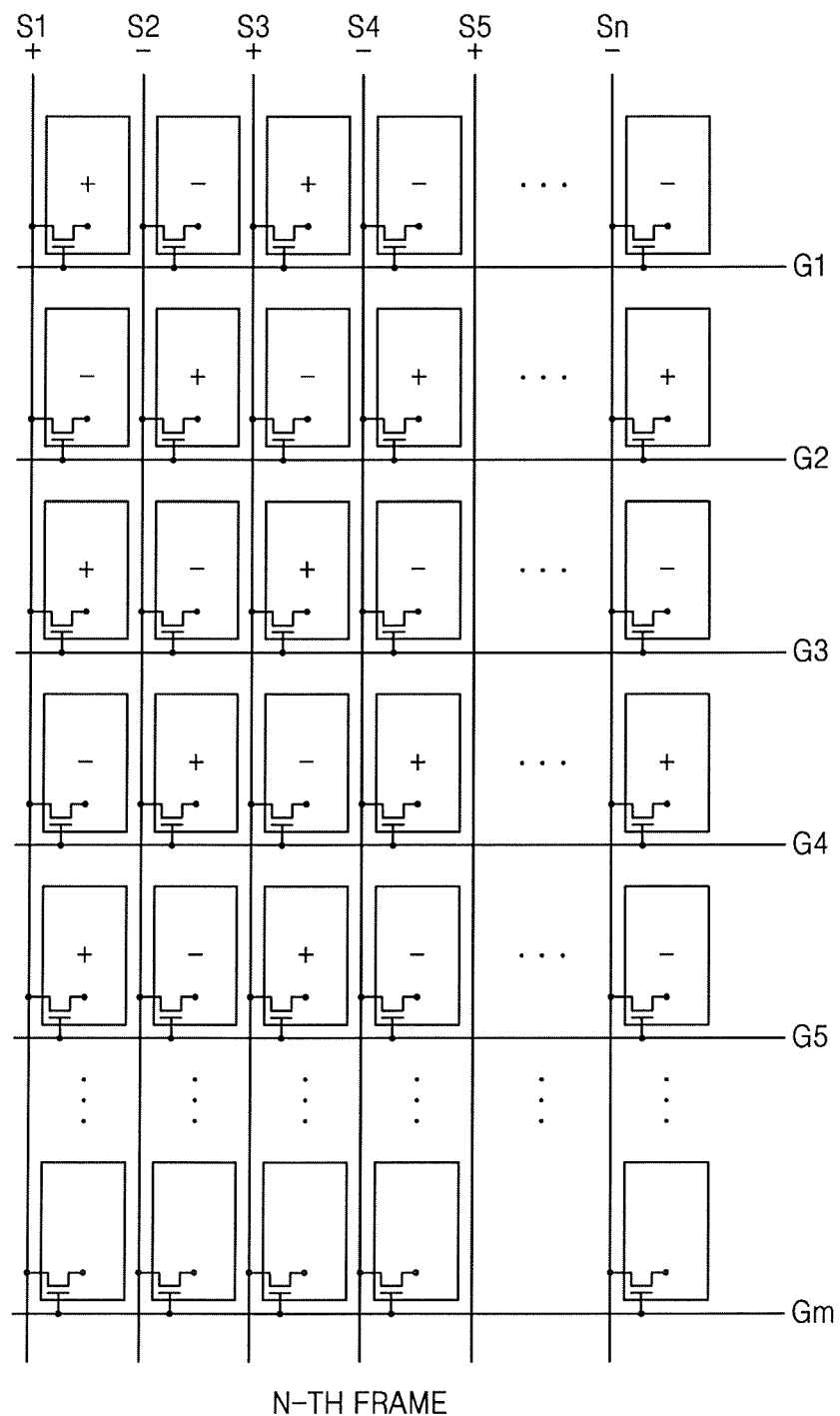
FIGS. 3A and 3B are diagrams showing polarities of voltages applied to pixels of two adjacent frames in a display device to which a dot inversion driving method is applied.
Figure 3B:
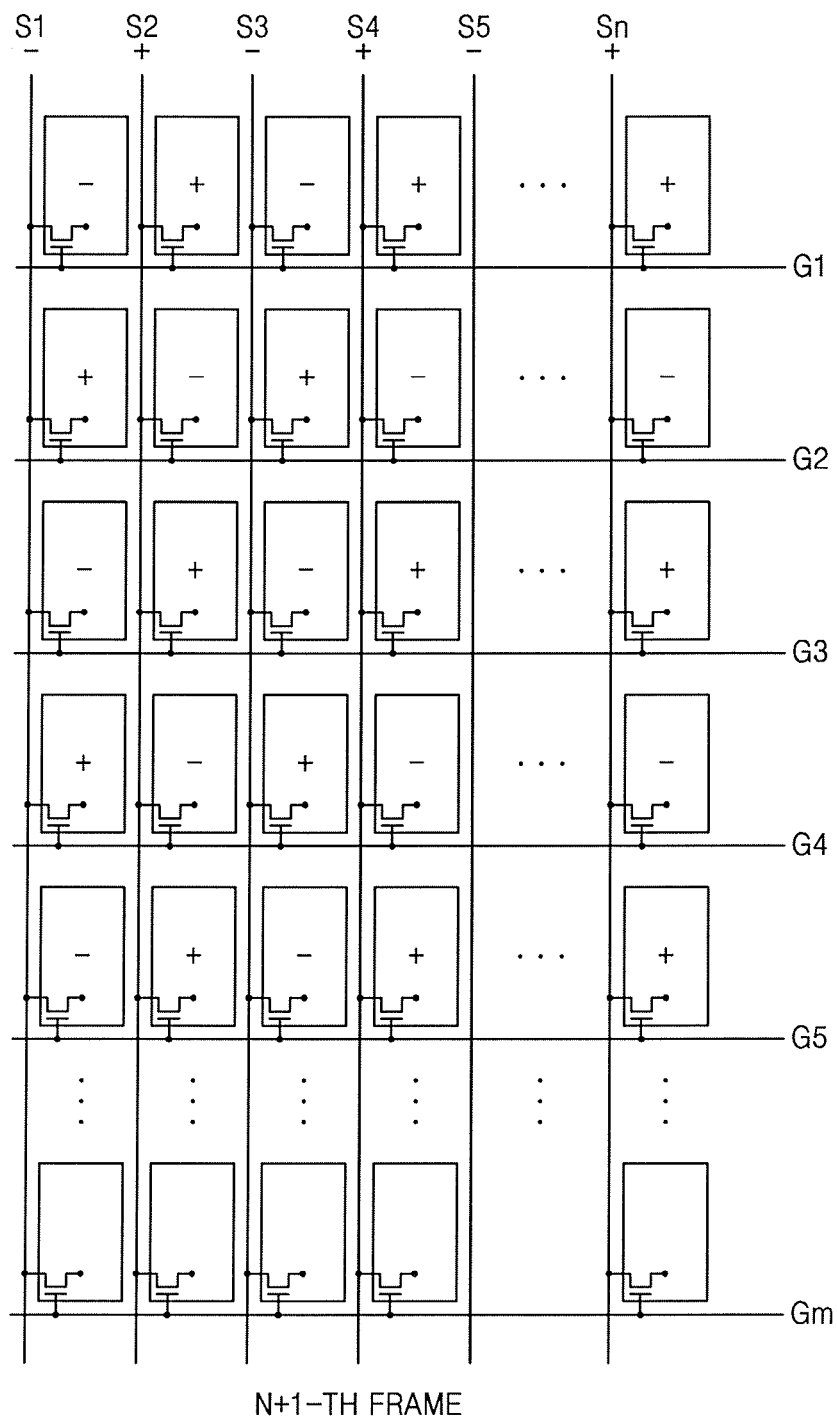

FIGS. 3A and 3B are diagrams showing polarities of voltages applied to pixels of two adjacent frames in a display device to which a dot inversion driving method is applied.

For example, FIG. 3A shows the polarities of voltages applied to pixels constituting an N-th frame (N is an integer equal to or more than 1) in a display panel 110, and FIG. 3B shows the polarities of voltages applied to pixels constituting an N+1-th frame of the display panel 110.

As shown in FIGS. 3A and 3B, the polarities of pixels in adjacent column lines may be inverted, and the polarities of pixels in adjacent row lines may be inverted. In addition, the polarities of the same pixels in adjacent frames may be inverted. For example, a pixel disposed at an intersection between a source line S1 and a gate line G1 of the N-th frame may have a positive (+) polarity, and a pixel disposed at an intersection between a source line S1 and a gate line G1 in the N+1-th frame may have a negative (−) polarity.

Various driving methods other than the above-described driving methods may be applied to exemplary embodiments of the inventive concept. As an example, a display driving method of inverting polarities of pixels in units of at least two columns and in units of at least two rows may be applied.

Figure 4:
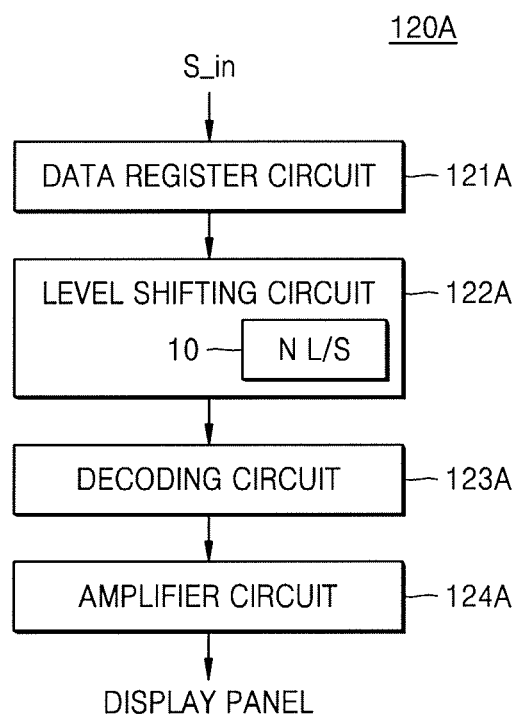
FIG. 4 is a diagram of a source driver shown in FIG. 1, according to an exemplary embodiment of the inventive concept.

FIG. 4 is a diagram of an example 120A of the source driver 120 shown in FIG. 1, according to an exemplary embodiment of the inventive concept.

As shown in FIG. 4, the source driver 120A may include a data register circuit 121A, a level shifting circuit 122A, a decoding circuit 123A, and an amplifier circuit 124A.

The data register circuit 121A may store a digital image signal S_in to be displayed on a display panel 110. For example, the data register circuit 121A may store a digital image signal corresponding to one horizontal line of the display panel 110. A digital image signal output by the data register circuit 121A may have a low voltage level. For example, a maximum voltage level of the digital image signal output by the data register circuit 121A may range from about 1.0V to about 2.5V.

However, voltages used to process signals of the decoding circuit 123A and the amplifier circuit 124A may have high voltage levels. For example, the voltages used to process the signals of the decoding circuit 123A and the amplifier circuit 124A may have a level of a positive or negative 10V or higher.

Accordingly, a level of the digital image signal S_in may be shifted and the digital signal having the shifted level may be applied to the decoding circuit 123A. To this end, the level shifting circuit 122A may be used.

The level shifting circuit 122A may shift a voltage level of the digital image signal output by the data register circuit 121A. The level shifting circuit 122A may include a negative-level shifting circuit (NL/S; 10). The negative-level shifting circuit 10 may perform a negative level shifting operation of shifting the digital image signal input by the data register circuit 121A from a low voltage level to a middle voltage level. For example, negative-level shifting circuit 10 may perform a negative level shifting operation of shifting a low voltage level of about 0V to about 2V to a middle voltage level of about −5.5V to about 0V.

In addition, the level shifting circuit 122A may also perform a positive level shifting operation. For example, the level shifting circuit 122A may perform a positive level shifting operation of shifting a low voltage level of the digital image signal to about 0V to about HAVDD, or perform a negative level shifting operation of shifting the low voltage level of the digital image signal to about −HAVDD to about 0V. Here, HAVDD refers to a voltage corresponding to ½ an analog driving voltage AVDD. For example, the level shifting circuit 122A may perform a positive level shifting operation of shifting a voltage level of about 0V to about 2V to a voltage level of about 0V to about 5.5V.

The decoding circuit 123A may generate an analog gradation voltage signal corresponding to the level-shifted digital image signal input by the level shifting circuit 122A. For example, the decoding circuit 123A may receive a level-shifted 8-bit digital image signal, and output an analog gradation voltage signal corresponding to the received level-shifted 8-bit digital image signal. For example, one gradation voltage may be selected from among gradation voltages of V0 to V255 and output in response to the received level-shifted 8-bit digital image signal.

The amplifier circuit 124A may receive the analog gradation voltage signal from the decoding circuit 123A, and amplify and output the received analog gradation voltage signal.

Figure 5:
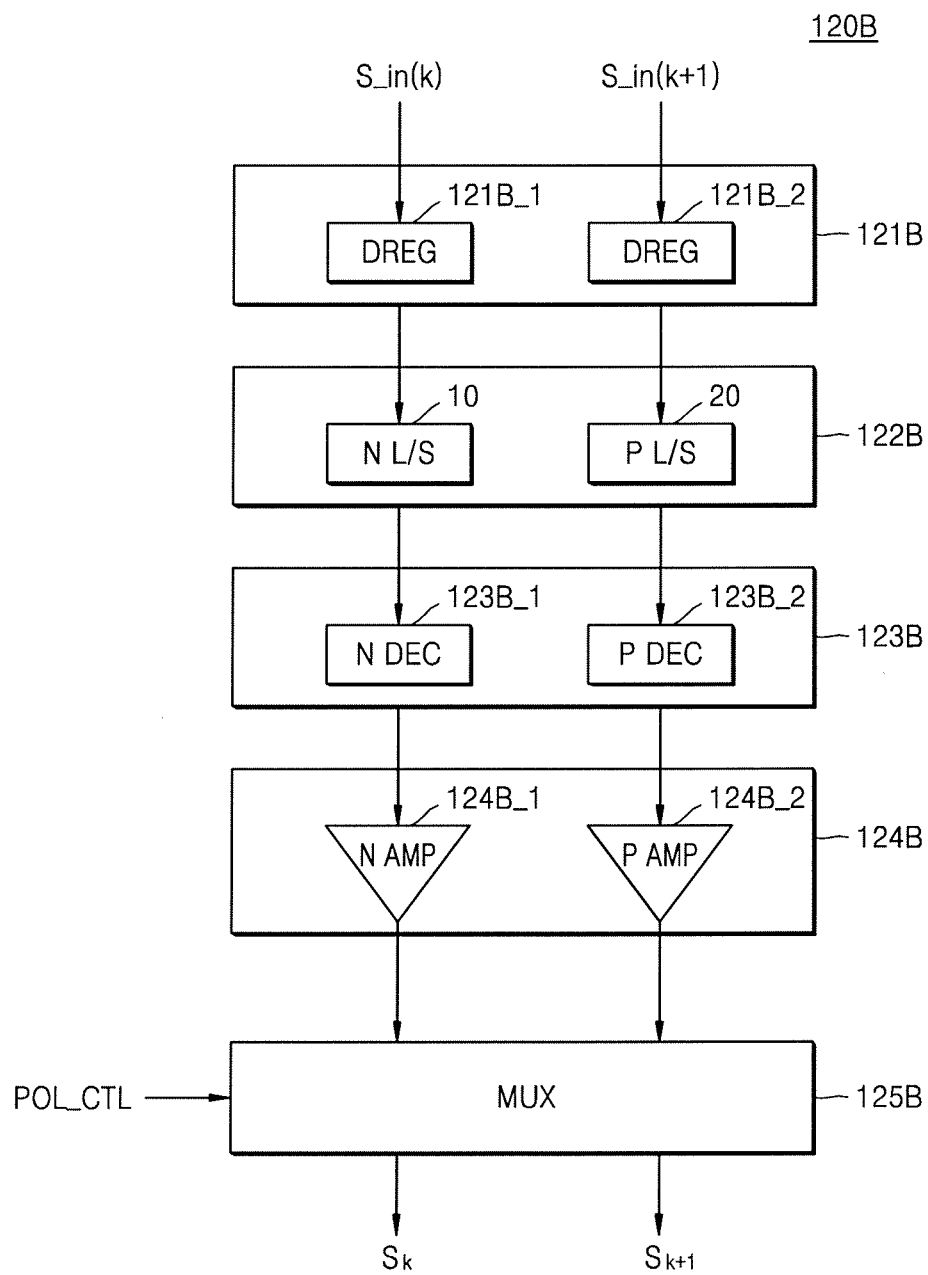
FIG. 5 is a diagram of the source driver shown in FIG. 1, according to an exemplary embodiment of the inventive concept.

FIG. 5 is a diagram of an example 120B of the source driver 120 shown in FIG. 1, according to an exemplary embodiment of the inventive concept.

FIG. 5 shows an example configuration of the source driver 120 of a display device to which a column inversion driving method or a dot inversion driving method is applied.

As shown in FIG. 5, the source driver 120B may include a data register circuit 121B, a level shifting circuit 122B, a decoding circuit 123B, an amplifier circuit 124B, and a multiplexer 125B.

The data register circuit 121B may store a digital image signal to be displayed on a display panel 110. For example, the digital register circuit 121B may store a digital image signal corresponding to one horizontal line of the display panel 110. The digital image signal output by the data register circuit 121B may have a low voltage level. For example, the digital image signal output by the data register circuit 121B may have a level of about 1.0V to about 2.5V.

The data register circuit 121B may include a plurality of data registers. For example, the data register circuit 121B may include data registers in equal number to the number of pixels included in one horizontal line of the display panel 110. For brevity, FIG. 5 illustrates two data registers (DREG; 121B-1 and 121B-2) configured to store digital image signals S_in(k) and S_in(k+1) to be output to two pixels disposed adjacent to each other in one horizontal line.

The level shifting circuit 122B may shift a voltage level of the digital image signal output by the data register circuit 121B. For example, the level shifting circuit 122B may perform a positive level shifting operation or a negative level shifting operation of shifting a voltage level of the digital image signal output by each of the two data registers 121B-1 and 121B-2.

The level shifting circuit 122B may include a negative-level shifting circuit (NL/S; 10) and a positive-level shifting circuit (PL/S; 20). Digital image signals to be output to an adjacent source line may be applied to different level shifting circuits. For example, when a digital image signal to be output to a k-th source line is applied to the negative-level shifting circuit 10, a digital image signal to be output to a k+1-th source line may be applied to the positive-level shifting circuit 20.

For example, the negative-level shifting circuit 10 may perform a level shifting operation of shifting a low voltage level of a digital image signal output by the first data register 121B-1 to a negative level having a middle voltage level.

For example, the negative-level shifting circuit 10 may include a first level shifter including a shielding circuit and a second level shifter. For example, the shielding circuit may be connected between an input circuit and a load circuit of the first level shifter, and configured to separate an operating voltage region of the input circuit from an operating voltage region of the load circuit so that the input circuit may operate in a positive voltage region and the load circuit may operate in a negative voltage region. The negative-level shifting circuit 10 may be embodied by medium-voltage-standard transistors. For example, the negative-level shifting circuit 10 may include level shifters of first and second stages, which include medium-voltage-standard transistors including a single negative power supply voltage and a single positive power supply voltage. In addition, the level shifter of the first stage may include a shielding circuit. The shielding circuit will be described in detail later.

As another example, the negative-level shifting circuit 10 may include level shifters of first, second, and third stages, which may include medium-voltage-standard transistors using two negative power supply voltages and a single positive power supply voltage.

The positive-level shifting circuit 20 may perform a level shifting operation of shifting a digital image signal having a low voltage level input by the second data register 121B-2 to a positive level having a medium voltage level. For example, the positive-level shifting circuit 20 may be configured to shift the low voltage level of the digital image signal input by the second data register 121B-2 to a level of about 0V to about HAVDD. The positive-level shifting circuit 122B-2 may be embodied by a medium-voltage-standard transistor.

The decoding circuit 123B may generate an analog gradation voltage signal corresponding to the level-shifted digital image signal input by the level shifting circuit 122B. The decoding circuit 123B may include a negative decoding circuit (NDEC; 123B-1) and a positive decoding circuit (PDEC; 123B-2).

The negative decoding circuit 123B-1 may generate a negative analog gradation voltage corresponding to the level-shifted digital image input by the negative-level shifting circuit 10. For example, the negative decoding circuit 123B-1 may receive a level-shifted 8-bit digital image signal, and output a negative analog gradation voltage signal corresponding to the received level-shifted 8-bit digital image signal. For example, one gradation voltage may be selected from among gradation voltages V0 to −V255 and output in response to the received level-shifted 8-bit digital image signal.

The positive decoding circuit 123B-2 may generate a positive analog gradation voltage corresponding to the level-shifted digital image signal input by the positive-level shifting circuit 20. For example, the positive decoding circuit 123B-2 may receive the level-shifted 8-bit digital image signal, and output a positive analog gradation voltage signal corresponding to the received level-shifted 8-bit digital image signal. For example, one gradation voltage may be selected from among gradation voltages V0 to +V255 and output in response to the received level-shifted 8-bit digital image signal.

The amplifier circuit 124B may receive an analog gradation voltage signal from the decoding circuit 123B, and amplify and output the received analog gradation voltage signal. The amplifier circuit 124B may include a negative amplifier circuit (NAMP; 124B-1) and a positive amplifier circuit (PAMP; 124B-2).

The negative amplifier circuit 124B-1 may receive a negative analog gradation voltage signal from the negative decoding circuit 123B-1, amplify the received negative analog gradation voltage signal, and output the amplified signal to the multiplexer 125B.

The positive amplifier circuit 124B-2 may receive a positive analog gradation voltage signal from the positive decoding circuit 123B-2, amplify the received positive analog gradation voltage signal, and output the amplified signal to the multiplexer 125B.

The multiplexer 125B may select one of an output signal of the negative amplifier circuit 124B-1 or an output signal of the positive amplifier circuit 124B-2 in response to a polarity control signal POL_CTL, and transmit the selected signal to a k-th source line $S_k$. In addition, the multiplexer 125B may select one of the output signal of the negative amplifier circuit 124B-1 or the output signal of the positive amplifier circuit 124B-2 in response to the polarity control signal POL_CTL, and transmit the selected signal to a k+1-th source line $S_{k+1}$.

For example, when the multiplexer 125B selects the output signal of the negative amplifier circuit 124B-1 and transmits the selected signal to the k-th source line $S_k$ in response to the polarity control signal POL_CTL, the multiplexer 125B may select the output signal of the positive amplifier circuit 124B-2 and transmit the selected signal to the k+1-th source line $S_{k+1}$.

As another example, when the multiplexer 125B selects the output signal of the positive amplifier circuit 124B-2 and transmits the selected signal to the k-th source line $S_k$ in response to the polarity control signal POL_CTL, the multiplexer 125B may select the output signal of the negative amplifier circuit 124B-1 and transmit the selected signal to the k+1-th source line $S_{k+1}$.

Figure 6A:
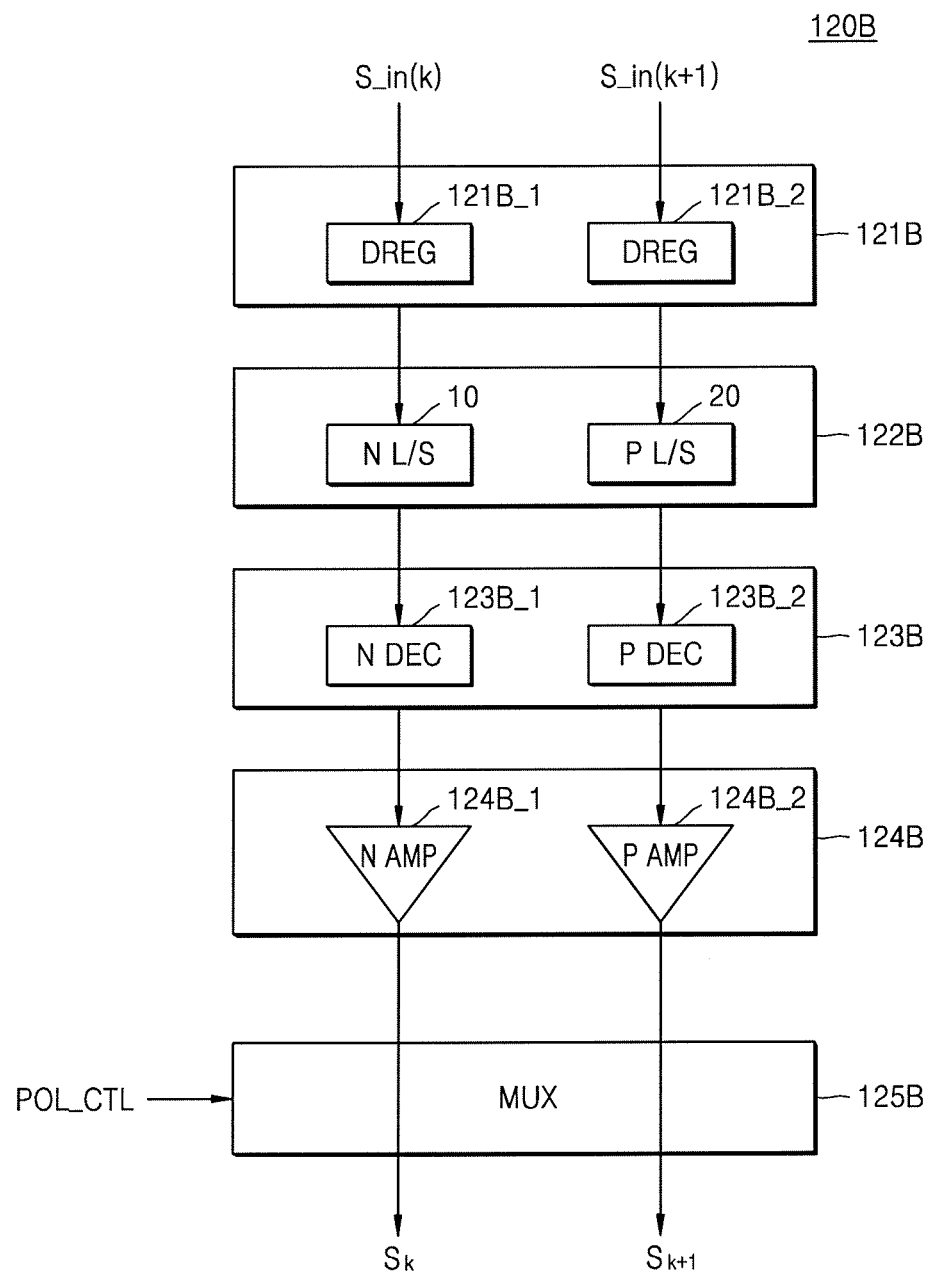
FIGS. 6A and 6B are diagrams of signal processing flows of the source driver 120B shown in FIG. 5 in two adjacent frames, according to an exemplary embodiment of the inventive concept.
Figure 6B:
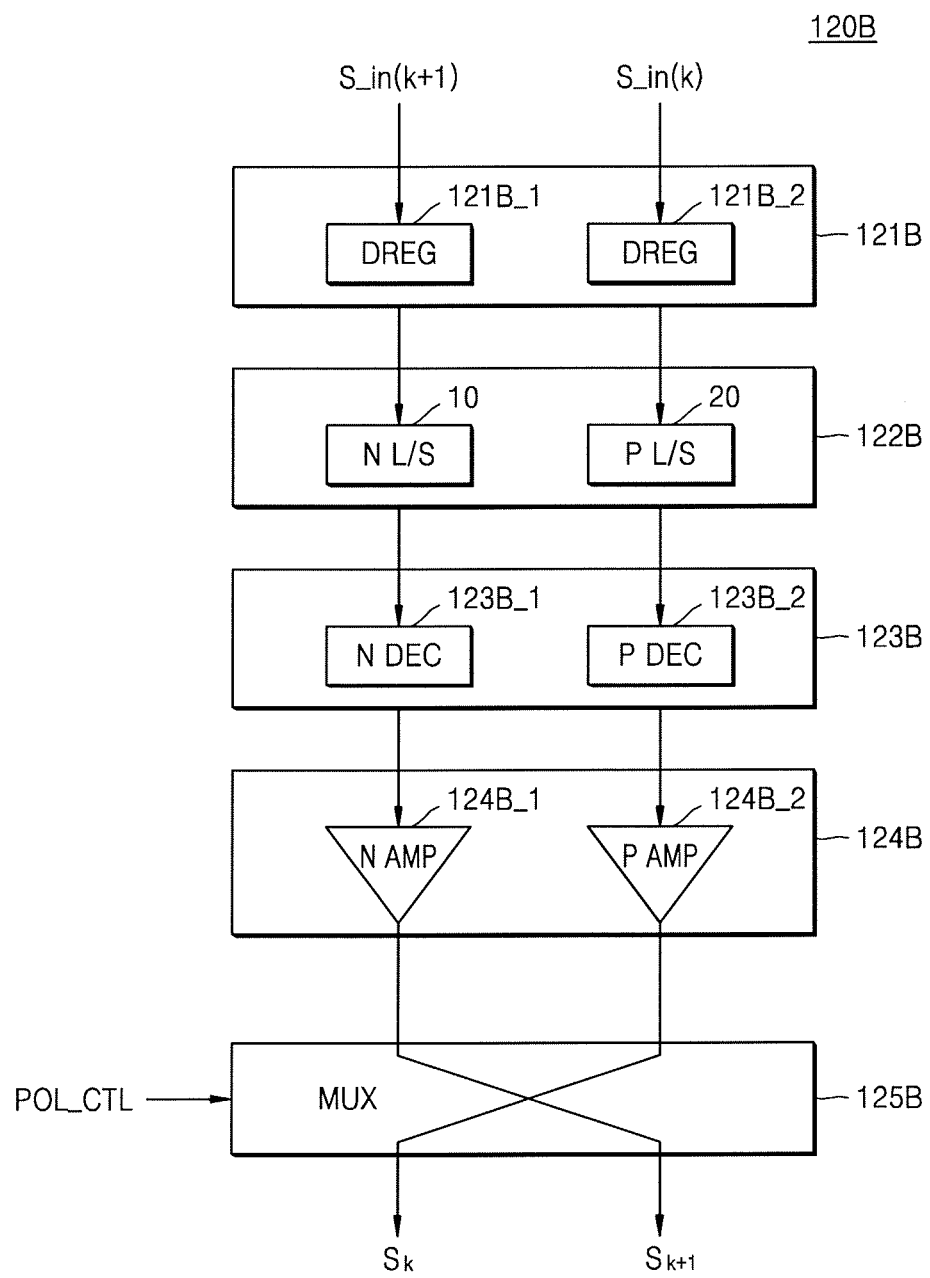

FIGS. 6A and 6B are diagrams of signal processing flows of the source driver 120B shown in FIG. 5 in two adjacent frames, according to an exemplary embodiment of the inventive concept.

FIG. 6A shows a signal processing flow of the source driver 120B in an N-th frame, and FIG. 6B shows a signal processing flow of the source driver 120B in an N+1-th frame.

Referring to FIG. 6A, in the N-th frame, a signal that has sequentially passed a first data register 121B-1, a negative-level shifting circuit 10, a negative decoding circuit 123B-1, and a negative amplifier circuit 124B-1 may be selected by a multiplexer 125B and applied to a k-th source line $S_k$. In addition, a signal that has sequentially passed a second data register 121B-2, a positive-level shifting circuit 20, a positive decoding circuit 123B-2, and a positive amplifier circuit 124B-2 may be selected by the multiplexer 125B and applied to a k+1-th source line $S_{k+1}$.

Referring to FIG. 6B, in the N+1-th frame, a signal that has sequentially passed a first data register 121B-1, a negative-level shifting circuit 10, a negative decoding circuit 123B-1, and a negative amplifier circuit 124B-1 may be selected by a multiplexer 125B and applied to a k+1-th source line $S_{k+1}$. In addition, a signal that has sequentially passed a second data register 121B-2, a positive-level shifting circuit 20, a positive decoding circuit 123B-2, and a positive amplifier circuit 124B-2 may be selected by the multiplexer 125B and applied to a k-th source line $S_k$.

Therefore, polarities of pixels connected to the same source line in adjacent frames may be inverted, and polarities of pixels connected to adjacent source lines in the same frame may be inverted.

Figure 7:
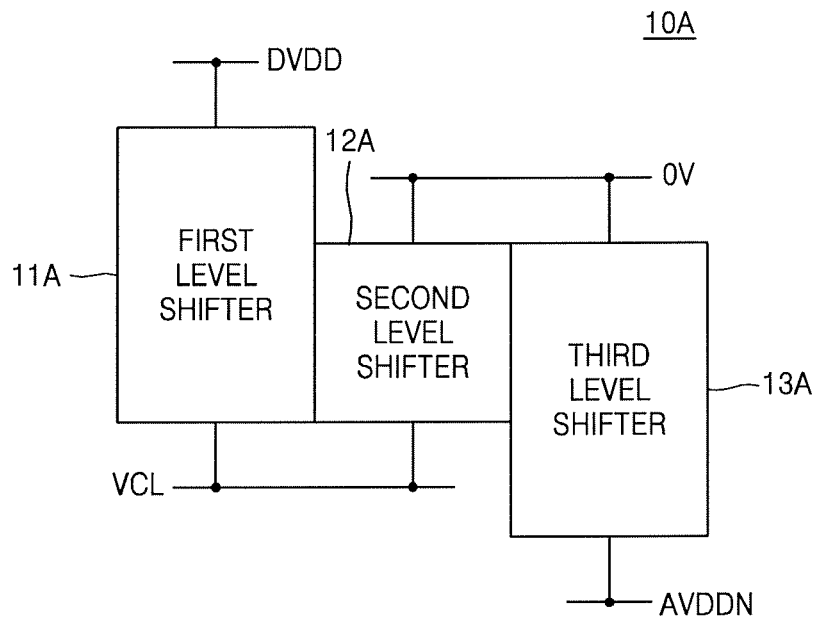
FIG. 7 is a diagram illustrating operations of a negative-level shifting circuit using an additional power source according to an exemplary embodiment of the inventive concept.

FIG. 7 is a diagram illustrating operations of a negative-level shifting circuit 10A using an additional power source according to an exemplary embodiment of the inventive concept.

As shown in FIG. 7, the negative-level shifting circuit 10A may include first, second, and third level shifters 11A, 12A, and 13A.

A positive first-power supply voltage DVDD and a negative third-power supply voltage VCL may be applied to the first level shifter 11A, a voltage of about 0V and the negative third-power supply voltage VCL may be applied to the second level shifter 12A, and the voltage of about 0V and a negative second-power supply voltage AVDDN may be applied to the third level shifter 13A. Each of the positive first-power supply voltage DVDD, the negative second-power supply voltage AVDDN, and the negative third-power supply voltage VCL may fall within a medium-voltage level range. For example, the positive first-power supply voltage DVDD may be set to about 1.8V, the negative second-power supply voltage AVDDN may be set to about −5.5V, and the negative third-power supply voltage VCL may be set to about −3V.

The first level shifter 11A may receive a logic signal having a low voltage of about 0V and a high voltage having a positive first-power supply voltage level, and output a signal having a low voltage having a voltage level equal or higher than the third power supply voltage VCL and a high voltage of which a level is shifted to the positive first-power supply voltage level.

The second level shifter 12A may receive a signal output by the first level shifter 11A, and output a signal having a low voltage equal to or higher than the third power supply voltage VCL and a high voltage of which a level is shifted to about 0V.

The third level shifter 13A may receive a signal output by the second level shifter 12A, and output a signal having a low voltage having the negative second-power supply voltage AVDDN and a high voltage of which a level is shifted to about 0V.

For example, the first level shifter 11A may receive a logic signal having a low voltage of about 0V and a high voltage of about 1.8V, and output a signal having a low voltage of about −3V and a high voltage of which a level is shifted to about 1.8V. The second level shifter 12A may receive a signal having a low voltage of about −3V and a high voltage of about 1.8V from the first level shifter 11A, and output a signal having a low voltage of about −3V and a high voltage of which a level is shifted to about 0V. The third level shifter 13A may receive a signal having a low voltage of about −3V and a high voltage of about 0V from the second level shifter 12A, and output a signal having a low voltage of about −5.5V and a high voltage of which a level is shifted to about 0V.

Thus, the negative-level shifting circuit 10A may receive a logic signal having a low voltage of about 0V and a high voltage of about 1.8V, and output a signal having a low voltage of about −5.5V and a high voltage of which a level is shifted to about 0V.

As described above, a difference between maximum voltage levels applied to circuit devices constituting the first, second, and third level shifters 11A, 12A, and 13A may not exceed about 6V. Accordingly, the first, second, and third level shifters 11A, 12A, and 13A may be use transistors having medium-voltage standards.

However, the negative-level shifting circuit 10A shown in FIG. 7 may use two kinds of negative power supply voltages and one positive power supply voltage. In other words, in addition to the positive first-power supply voltage DVDD and the negative second-power supply voltage AVDDN, the negative third-power supply voltage VCL may be applied. In addition, the negative-level shifting circuit 10A may be a 3-stage level shifter circuit.

In an exemplary embodiment of the inventive concept, a negative-level shifting circuit, which does not use an additional power source, will be described later.

Figure 8:
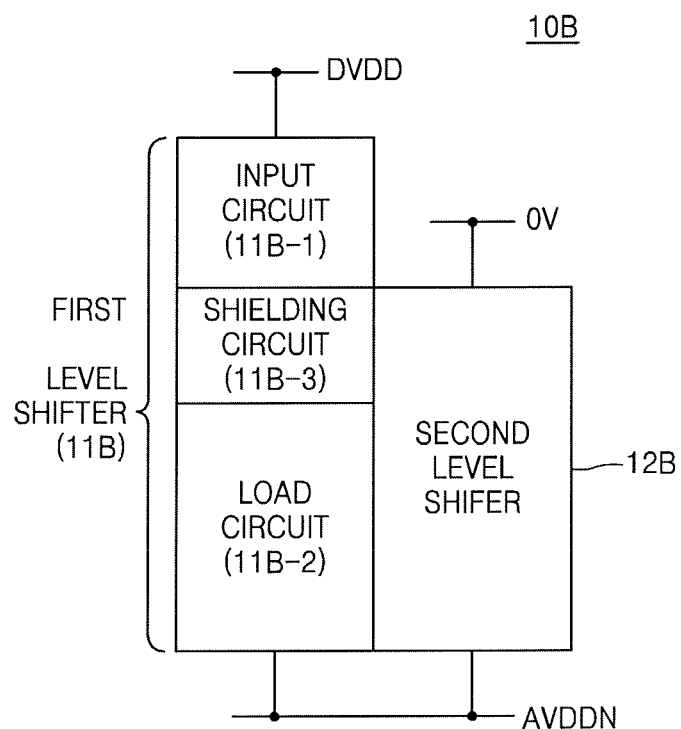
FIG. 8 is a diagram illustrating operations of a negative-level shifting circuit that does not use an additional power source, according to an exemplary embodiment of the inventive concept.

FIG. 8 is a diagram illustrating operations of a negative-level shifting circuit 10B that does not use an additional power source, according to an exemplary embodiment of the inventive concept.

As shown in FIG. 8, the negative-level shifting circuit 10B may include first and second level shifters 11B and 12B.

The first level shifter 11B may be configured such that a shielding circuit 11B-3 is connected between an input circuit 11B-1 and a load circuit 11B-2. The shielding circuit 11B-3 may separate an operating voltage region of the input circuit 11B-1 from an operating voltage region of the load circuit 11B-2 so that the input circuit 11B-1 may operate in a positive voltage region and the load circuit 11B-2 may operate in a negative voltage region.

A positive first-power supply voltage DVDD and a negative second-power supply voltage AVDDN may be applied to the first level shifter 11B, and a voltage of about 0V and the negative second-power supply voltage AVDDN may be applied to the second level shifter 12B. Each of the positive first-power supply voltage DVDD and the negative second-power supply voltage AVDDN may fall within a medium-voltage level range. For example, the positive first-power supply voltage DVDD may be set to about 1.8V, and the negative second-power supply voltage AVDDN may be set to about −5.5V.

For example, when the positive first-power supply voltage DVDD is set to about 1.8V and the negative second-power supply voltage AVDDN is set to about −5.5V, the first level shifter 11B and the second level shifter 12B may operate as follows.

The first level shifter 11B may receive a logical signal having a low voltage of about 0V and a high voltage of about 1.8V, and output a signal having a low voltage of about −5.5V to about −5.0V and a high voltage which is shifted to about −1.0V to about −2.5V. The second level shifter 12B may receive a signal having a low voltage of about −5.5V to about −5.0V and a high voltage of about −1.0V to about −2.5V from the first level shifter 11B, and output a signal having a low voltage of about −5.5V and a high voltage which is level shifted to about 0V.

Thus, the negative-level shifting circuit 10B may receive a logic signal having a low voltage of about 0V and a high voltage of about 1.8V, and output a signal having a low voltage of about −5.5V and a high voltage which is level shifted to about 0V.

Due to the above-described shielding circuit 11B-3, transistors of the first level shifter 11B may be medium-voltage standards.

Referring to FIG. 8, the negative-level shifting circuit 10B may use one negative power supply voltage and one positive power supply voltage. In other words, the positive first-power supply voltage DVDD and the negative second-power supply voltage AVDDN may be applied to the negative-level shifting circuit 10B. The negative third-power supply voltage VCL may not be used. In addition, the negative-level shifting circuit 10B may be a 2-stage level shifter circuit.

Figure 9:
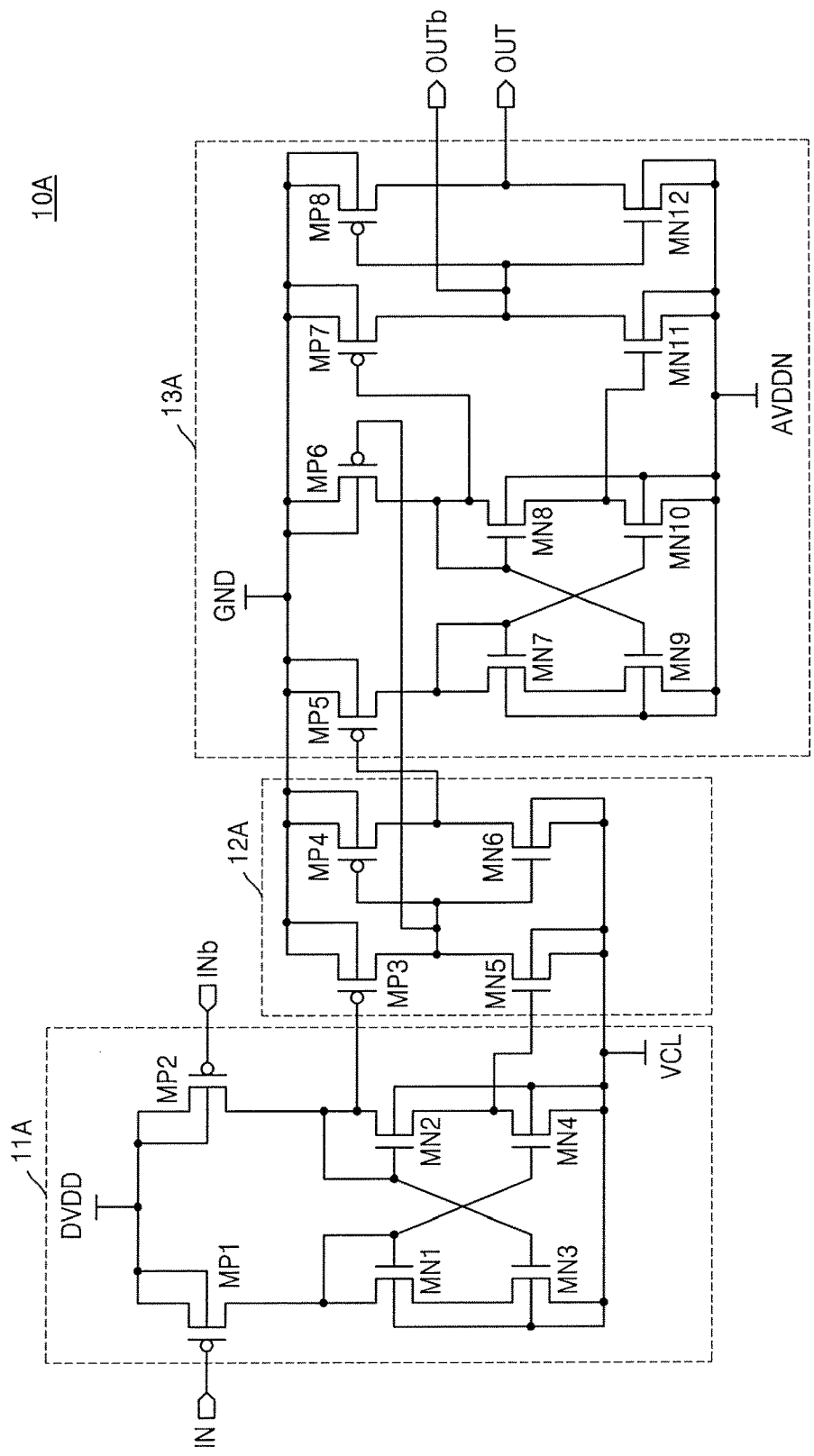
FIG. 9 is a detailed diagram of a negative-level shifting circuit using an additional power source according to an exemplary embodiment of the inventive concept.

FIG. 9 is a detailed diagram of a negative-level shifting circuit 10A using an additional power source according to an exemplary embodiment of the inventive concept.

Referring to FIG. 9, the negative-level shifting circuit 10A may include first, second, and third level shifters 11A, 12A, and 13A.

The first level shifter 11A may include two PMOS transistors MP1 and MP2 and four NMOS transistors MN1 to MN4. An input signal IN and an inverted input signal INb may be respectively applied to gate terminals of the two PMOS transistor MP1 and MP2. The four NMOS transistors MN1 to MN4 may be load circuits, which may correspond to a cross-coupled load circuit. A positive first-power supply voltage DVDD and a negative third-power supply voltage VCL may be applied to the first level shifter 11A. The positive first-power supply voltage DVDD may be applied to a body of each of the two PMOS transistors MP1 and MP2, and the negative third-power supply voltage VCL may be applied to a body of each of the four NMOS transistors MN1 to MN4.

The second level shifter 12A may include two PMOS transistors MP3 and MP4 and two NMOS transistors MN5 and MN6. A drain terminal of the PMOS transistor MP2 of the first level shifter 11A may be connected to a gate terminal of the PMOS transistor MP3, and a drain terminal of the NMOS transistor MN4 of the first level shifter 11A may be connected to a gate terminal of the NMOS transistor MN5. A ground voltage GND (e.g., a voltage of about 0V) and the negative third-power supply voltage VCL may be applied to the second level shifter 12A. A voltage of about 0V may be applied to a body of each of the two PMOS transistors MP3 and MP4, and the negative third-power supply voltage VCL may be applied to each of the two NMOS transistors MN5 and MN6.

The third level shifter 13A may include four PMOS transistors MP5 to MP8 and six NMOS transistors MN7 to MN12. A drain terminal of the PMOS transistor MP4 of the second level shifter 12A may be connected to a gate terminal of the PMOS transistor MP5, and a drain terminal of the PMOS transistor MP3 of the second level shifter 12A may be applied to a gate terminal of the PMOS transistor MP6. A voltage GND of about 0V and a negative second-power supply voltage AVDDN may be applied to the third level shifter 13A. The voltage of about 0V may be applied to a body of each of the four PMOS transistors MP5 to MP8, and the negative second-power supply voltage AVDDN may be applied to a body of each of the six NMOS transistors MN7 to MN12.

For example, the positive first-power supply voltage DVDD may be set to about 1.8V, the negative second-power supply voltage AVDDN may be set to about −5.5V, and the negative third-power supply voltage VCL may be set to about −3V.

Therefore, operations of the negative-level shifting circuit 10A shown in FIG. 9 will be described on the assumption that the positive first-power supply voltage DVDD is about 1.8V, the negative second-power supply voltage AVDDN is about −5.5V, and the negative third-power supply voltage VCL is about −3V.

The first level shifter 11A may receive the input signal IN and the inverted input signal INb at the gate terminal of each of the two PMOS transistors MP1 and MP2.

To begin with, when the input signal IN applied to the gate terminal of each of the two PMOS transistors MP1 and MP2 is at a high state (about 1.8 V) and the inverted signal INb applied to the gate terminal of each of the two PMOS transistors MP1 and MP2 is at a low state (about 0V), the first level shifter 11A may operate as follows.

For example, the PMOS transistor MP1 may be turned off, and the PMOS transistor MP2 may be turned on. Thus, a voltage of the drain terminal of the PMOS transistor MP2 may be about 1.8V. Since the drain terminal of the PMOS transistor MP2 is connected to a gate terminal of the NMOS transistor MN2 and a gate terminal of the NMOS transistor MN3, the NMOS transistor MN2 and MN3 may be turned on. Thus, each of a drain terminal of the NMOS transistor MN3 and a drain terminal of the NMOS transistor MN1 may be about −3V. In addition, since the NMOS transistor MN4 is turned off, a voltage of a drain terminal of the NMOS transistor MN4 may be about 1.8V.

Next, when the input signal IN applied to the gate terminal of each of the two PMOS transistors MP1 and MP2 is in a low state (about 0V), and the inverted input signal INb applied to the gate terminal of each of the two PMOS transistors MP1 and MP2 is in a high state (about 1.8V), the first level shifter 11A may operate as follows.

For example, the PMOS transistor MP1 may be turned on, and the PMOS transistor MP2 may be turned off. Thus, a voltage of a drain terminal of the PMOS transistor MP1 may be about 1.8V. Since a drain terminal of the PMOS transistor MP1 is connected to a gate terminal of the NMOS transistor MN1 and a gate terminal of the NMOS transistor MN4, the NMOS transistors MN1 and MN4 may be turned on. Thus, each of the drain terminal of the NMOS transistor MN4 and a drain terminal of the NMOS transistor MN2 may have a voltage of about −3V. In addition, since the NMOS transistor MN3 is turned off, a voltage of the drain terminal of the NMOS transistor MN3 may be about 1.8V.

Due to the above-described operations, the first level shifter 11A may receive a logic signal having a low voltage of about 0V and a high voltage of about 1.8V, and generate a signal having a low voltage of about −3V and a high voltage which is level shifted to about 1.8V.

Next, operations of the second level shifter 12A will be described.

When the input signal IN is in a high state (1.8V) and the inverted input signal INb is in a low state (0V), a voltage of about 1.8V may be applied from the first level shifter 11A to the gate terminal of the PMOS transistor MP3 of the second level shifter 12A and the gate terminal of the NMOS transistor MN5 of the second level shifter 12A.

Thus, the PMOS transistor MP3 may be turned off, and the NMOS transistor MN5 may be turned on. As a result, a voltage of a drain terminal of the NMOS transistor MN5 may be about −3V. In addition, the PMOS transistor MP4 may be turned on, and the NMOS transistor MN6 may be turned off. As a result, a voltage of the drain terminal of the NMOS transistor MN6 may be about 0V.

Due to the above-described operations, the second level shifter 12A may receive a logic signal having a low voltage of about −3V and a high voltage of about 1.8V from the first level shifter 11A, and generate a signal having a low voltage of about −3V and a high voltage of which a level is shifted to about 0V.

Next, operations of the third level shifter 13A will be described.

When the input signal IN is in a high state (1.8V) and the inverted input signal INb is in a low state (0V), the second level shifter 12A may transmit a voltage of about 0V to the gate terminal of the PMOS transistor MP5 of the third level shifter 13A and transmit a voltage of about −3V to the gate terminal of the PMOS transistor MP6 of the third level shifter 13A.

Thus, the PMOS transistor MP5 may be turned off, and the PMOS transistor MP6 may be turned on. As a result, a voltage of a drain terminal of the PMOS transistor MP6 may be about 0V. In addition, a source terminal of the NMOS transistor MN8 may have a voltage of about 0V. Thus, the NMOS transistor MN11 may be turned on, and the PMOS transistor MP7 may be turned off. As a result, a voltage of an inverted output terminal OUTb may be about −5.5V, and a voltage of an output terminal OUT may be about 0V.

Due to the above-described operations, the third level shifter 13A may receive a logic signal having a low voltage of about −3V and a high voltage which is level shifted to about 0V from the second level shifter 12A, and generate a signal having a low voltage of about −5.5V and a high voltage which is level shifted to about 0V.

Accordingly, the negative-level shifting circuit 10A may receive a logic signal having a low voltage of about 0V and a high voltage of about 1.8V, and output a signal having a low voltage of about −5.5V and a high voltage which is level shifted to about 0V.

Figure 10:
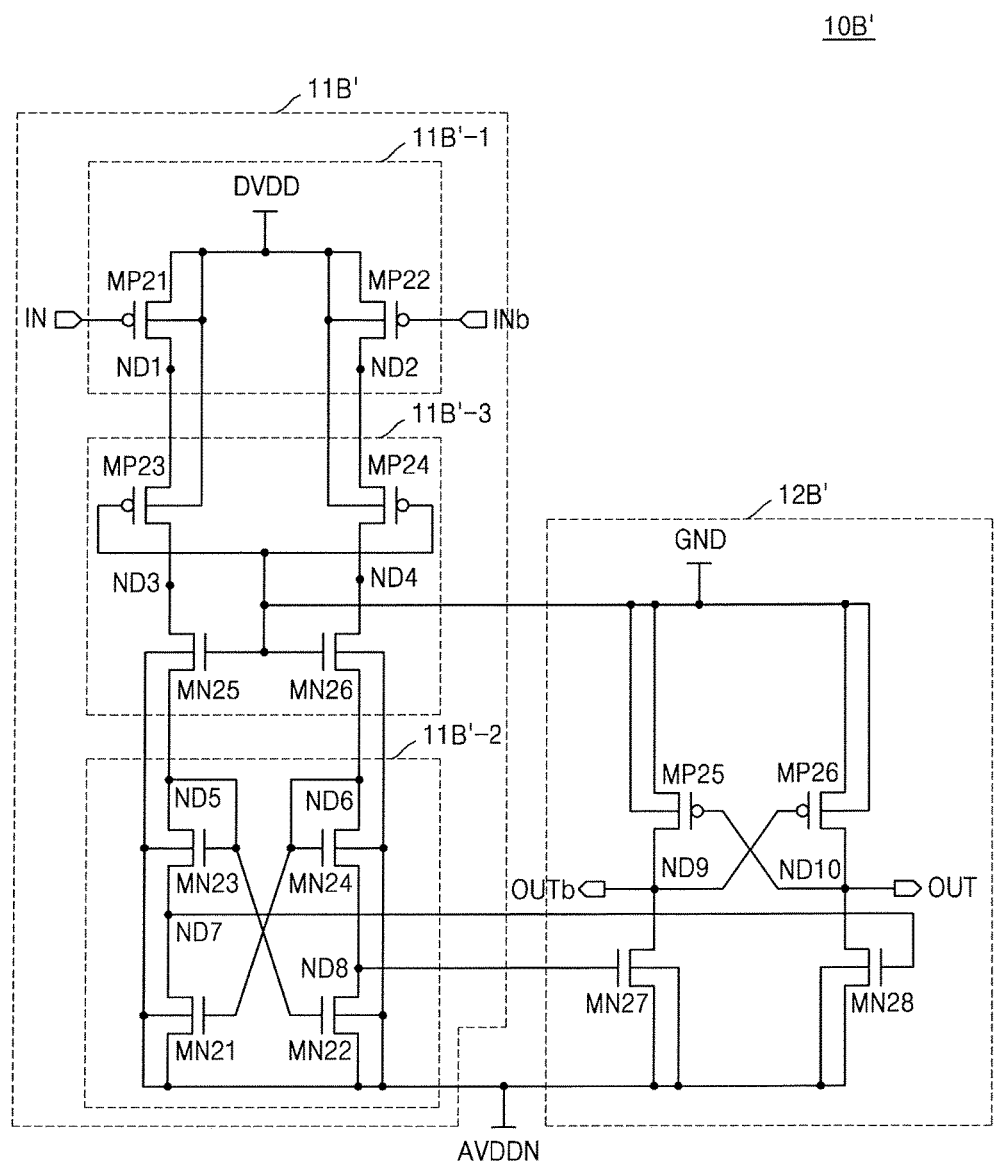
FIG. 10 is a detailed diagram of a negative-level shifting circuit, which does not use an additional power source, according to an exemplary embodiment of the inventive concept.

FIG. 10 is a detailed diagram of an example 10B' of a negative-level shifting circuit, which does not use an additional power source, according to an exemplary embodiment of the inventive concept.

Referring to FIG. 10, the negative-level shifting circuit 10B' may include first and second level shifters 11B' and 12B'.

One negative power supply voltage and one positive power supply voltage may be applied to the negative-level shifting circuit 10B'. For example, a positive first-power supply voltage DVDD and a negative second-power supply voltage AVDDN may be applied to the negative-level shifting circuit 10B'.

The first level shifter 11B' may include an input circuit 11B'-1, a load circuit 11B'-2, and a shielding circuit 11B'-3. For example, the input circuit 11B'-1 may include two PMOS transistors MP21 and MP22, the load circuit 11B'-2 may include four NMOS transistors MN21 to MN24, and the shielding circuit 11B'-3 may include two PMOS transistors MP23 and MP24 and two NMOS transistors MN25 and MN26.

An input signal IN may be applied to a gate terminal of the PMOS transistor MP21 of the input circuit 11B'-1, and an inverted input signal INb may be applied to a gate terminal of the PMOS transistor MP22 of the input circuit 11B'-1. In addition, respective gate terminals of the two PMOS transistor MP23 and MP24 and the two NMOS transistor MN25 and MN26 of the shielding circuit 11B'-3 may be connected to a voltage GND (0V).

The second level shifter 12B' may include two PMOS transistors MP25 and MP26 and the two NMOS transistors MN27 and MN28. A drain terminal of the NMOS transistor MN22 of the first level shifter 11B' may be connected to a gate terminal of the NMOS transistor MN27, and a drain terminal of the NMOS transistor MN21 of the first level shifter 11B' may be connected to a gate terminal of the NMOS transistor MN28.

For example, the positive first-power supply voltage DVDD may be set to about 1.8V, and the negative second-power supply voltage AVDDN may be set to about −5.5V.

A detailed configuration of the negative-level shifting circuit 10B' will now be described.

To begin with, a detailed configuration of the first level shifter 11B' will now be described.

In the input circuit 11B'-1, the positive first-power supply voltage DVDD may be applied to a source terminal of the PMOS transistor MP21, the input signal IN may be applied to the gate terminal of the PMOS transistor MP21, and a drain terminal of the PMOS transistor MP21 may be connected to a first node ND1. The positive first-power supply voltage DVDD may be applied to a source terminal of the PMOS transistor MP22, the inverted input signal INb may be applied to the gate terminal of the PMOS transistor MP22, and a drain terminal of the PMOS transistor MP22 may be connected to a second node ND2.

In the shielding circuit 11B'-3, a source terminal of the PMOS transistor MP23 may be connected to the first node ND1, the voltage GND of about 0V may be applied to the gate terminal of the PMOS transistor MP23, and a drain terminal of the PMOS transistor MP23 may be connected to a third node ND3. A source terminal of the PMOS transistor MP24 may be connected to the second node ND2, the voltage GND of about 0V may be applied to the gate terminal of the PMOS transistor MP24, and a drain terminal of the PMOS transistor MP24 may be connected to a fourth node ND4. A drain terminal of the NMOS transistor MN25 may be connected to the third node ND3, the voltage GND of about 0V may be applied to a gate terminal of the NMOS transistor MN25, and a source terminal of the NMOS transistor MN25 may be connected to a fifth node ND5. A drain terminal of the NMOS transistor MN26 may be connected to the fourth node ND4, the voltage GND of about 0V may be applied to a gate terminal of the NMOS transistor MN26, and a source terminal of the NMOS transistor MN26 may be connected to a sixth node ND6.

In the load circuit 11B'-2, a drain terminal and a gate terminal of the NMOS transistor MN23 may be connected to the fifth node ND5, and a source terminal of the NMOS transistor MN23 may be connected to a seventh node ND7. A drain terminal and a gate terminal of the NMOS transistor MN24 may be connected to the sixth node ND6, and a source terminal of the NMOS transistor MN24 may be connected to an eighth node ND8. The drain terminal of the NMOS transistor MN21 may be connected to the seventh node ND7, a gate terminal of the NMOS transistor MN21 may be connected to the sixth node ND6, and the negative second-power supply voltage AVDDN may be applied to a source terminal of the NMOS transistor MN21. The drain terminal of the NMOS transistor MN22 may be connected to the eighth node ND8, a gate terminal of the NMOS transistor MN22 may be connected to the fifth node ND5, and the negative second-power supply voltage AVDDN may be applied to a source terminal of the NMOS transistor MN22.

The positive first-power supply voltage DVDD may be applied to a body of each of the four PMOS transistors MP21 to MP24, and the negative second-power supply voltage AVDDN may be applied to a body of each of the six NMOS transistors MN21 to MN26.

The PMOS transistors MP23 and MP24 of the shielding circuit 11B'-3 may prevent the negative second-power supply voltage AVDDN from being applied to the first node ND1 and the second node ND2, respectively. Each of the NMOS transistors MN25 and MN26 of the shielding circuit 11B'-3 may be a shielding transistor such that each of the gate terminals of the NMOS transistors MN21 to MN24 is maintained at a voltage of (GND−Vthn). Here, Vthn denotes a threshold voltage of the NMOS transistor MN25 or MN26.

Next, a detailed configuration of the second level shifter 12B' will be described.

The voltage GND of about 0V may be applied to a source terminal of the PMOS transistor MP25, a gate terminal of the PMOS transistor MP25 may be connected to a tenth node ND10, and a drain terminal of the PMOS transistor MP25 may be connected to a ninth node ND9. The voltage GND of about 0V may be applied to a source terminal of the PMOS transistor MP26, a gate terminal of the PMOS transistor MP26 may be connected to the ninth node ND9, and a drain terminal of the PMOS transistor MP26 may be connected to the tenth node ND10. A drain terminal of the NMOS transistor MN27 may be connected to the ninth node ND9, the gate terminal of the NMOS transistor MP27 may be connected to the eighth node ND8 of the first level shifter 11B', and the negative second-power supply voltage AVDDN may be applied to a source terminal of the NMOS transistor MP27. A drain terminal of the NMOS transistor MN28 may be connected to the tenth node ND10, the gate terminal of the NMOS transistor MN28 may be connected to the seventh node ND7 of the first level shifter 11B', and the negative second-power supply voltage AVDDN may be applied to a source terminal of the NMOS transistor MN28.

The voltage GND of about 0V may be applied to a body of each of the two PMOS transistors MP25 and MP26, and the negative second-power supply voltage AVDDN may be applied to a body of each of the two NMOS transistors MN27 and MN28.

Therefore, operations of the negative-level shifting circuit 10B' shown in FIG. 10 will be described on the assumption that the positive first-power supply voltage DVDD is about 1.8V and the negative second-power supply voltage AVDDN is about −5.5V.

For example, when the input signal IN is in a high state (1.8V) and the inverted input signal INb is in a low state (0V), the negative-level shifting circuit 10B' will operate as follows.

The PMOS transistor MP21 may be turned off, and the PMOS transistor MP22 may be turned on. Thus, a voltage of the second node ND2 may be about 1.8V. In addition, the PMOS transistor MP24 may be turned on so that a voltage of the fourth node ND4 may be about 1.8V. Furthermore, a voltage of the sixth node ND6 may be limited to (GND−Vthn26) by the NMOS transistor MN26. A voltage of the eighth node ND8 may be {GND−(Vthn26+Vthn24)}. Here, Vthn26 denotes a threshold voltage of the NMOS transistor MN26, and Vthn24 denotes a threshold voltage of the NMOS transistor MN24.

Thus, since a voltage of the gate terminal of the NMOS transistor MN21 becomes (GND−Vthn26), the NMOS transistor MN21 may be turned on so that a voltage of the seventh node ND7 may be −5.5V. In addition, a voltage of the fifth node ND5 may become (−5.5V+Vthn23). Here, Vthn23 denotes a threshold voltage of the NMOS transistor MN23.

The NMOS transistor MN22 may be turned off so that a voltage of the eighth node ND8 may remain {GND−(Vthn26+Vthn24)}. In addition, the NMOS transistor MN25 may be turned on so that a voltage of the third node ND3 may become −5.5V. Furthermore, a voltage of the first node ND1 may be limited to (GND+Vthp23) by the PMOS transistor MP23. Here, Vthp23 denotes a threshold voltage of the PMOS transistor MP23. Accordingly, the PMOS transistor MP23 may prevent a voltage of about −5.5 V from being applied to the first node ND1.

Since the gate terminal of the NMOS transistor MN27 is connected to the eighth node ND8 and the gate terminal of the NMOS transistor MN28 is connected to the seventh node ND7, a voltage of the gate terminal of the NMOS transistor MN27 may become {GND−(Vthn26+Vthn24)}, and a voltage of the gate terminal of the NMOS transistor MN28 may become about −5.5V.

Thus, the NMOS transistor MN27 may be turned on, and the NMOS transistor MN28 may be turned off. Therefore, a voltage of the ninth node ND9 may become about −5.5V, and a voltage of the tenth node ND10 may become about 0V.

Since the tenth node ND10 is set as an output terminal OUT and the ninth node ND9 is set as an inverted output terminal OUTb, a voltage of the output terminal OUT may be about 0V, and a voltage of the inverted output terminal OUTb may be about −5.5V.

Accordingly, the negative-level shifting circuit 10B' may receive a logic signal having a low voltage of about 0V and a high voltage of about 1.8V, and output a signal having a low voltage of about −5.5V and a high voltage which is level shifted to about 0V.

As shown in FIG. 10, since each of the gate terminals of the four transistors MP23, MP24, MN25, and MN26 of the shielding circuit 11B'-3 has a voltage of about 0V, a gate-body voltage, a gate-source voltage, and a gate-drain voltage may be within an allowable limit of medium-voltage standards.

Figure 11:
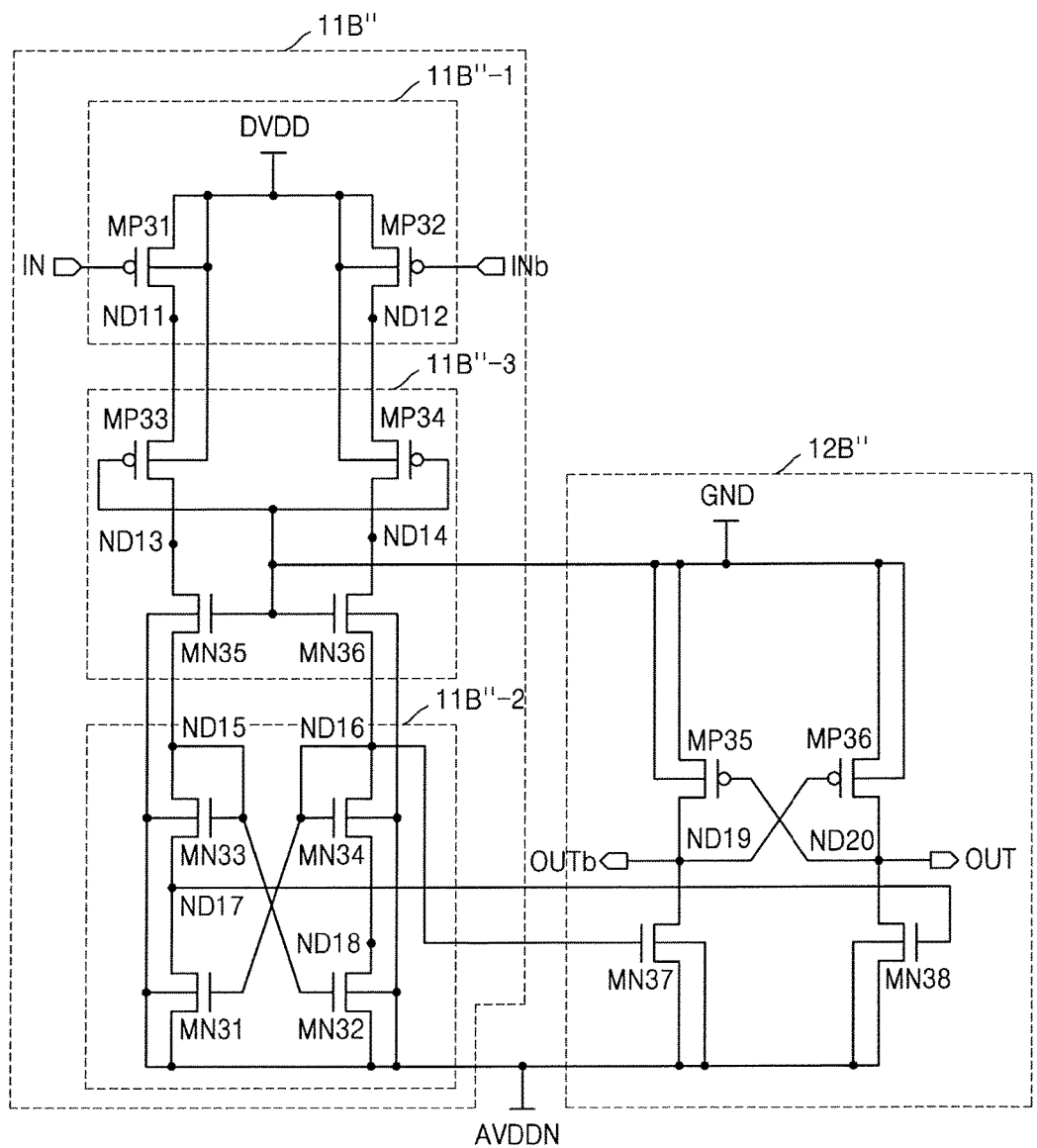
FIG. 11 is a detailed diagram of a negative-level shifting circuit, which does not use an additional power source, according to an exemplary embodiment of the inventive concept.

FIG. 11 is a detailed diagram of an example 10B" of a negative-level shifting circuit, which does not use an additional power source, according to an exemplary embodiment of the inventive concept.

Referring to FIG. 11, the negative-level shifting circuit 10B" may include first and second level shifters 11B" and 12B".

One negative power supply voltage and one positive power supply voltage may be applied to the negative-level shifting circuit 10B". For example, a positive first-power supply voltage DVDD and a negative second-power supply voltage AVDDN may be applied to the negative-level shifting circuit 10B".

The first level shifter 11B" may include an input circuit 11B"-1, a load circuit 11B"-2, and a shielding circuit 11B"-3. For example, the input circuit 11B"-1 may include two PMOS transistors MP31 and MP32, the load circuit 11B"-2 may include four NMOS transistors MN31 to MN34, and the shielding circuit 11B"-3 may include two PMOS transistors MP33 and MP34 and two NMOS transistors MN35 and MN36.

An input signal IN may be applied to a gate terminal of the PMOS transistor MP31 of the input circuit 11B"-1, and an inverted input signal INb may be applied to a gate terminal of the PMOS transistor MP32 of the input circuit 11B"-1. In addition, each of the gate terminals of the two PMOS transistors MP33 and MP34 and the two NMOS transistors MN35, MN36 that constitute the shielding circuit 11B"-3 may be connected to a voltage GND (0V).

The second level shifter 12B" may include two PMOS transistors MP35 and MP36 and two NMOS transistors MN37 and MN38. A drain terminal of the NMOS transistor MN34 of the first level shifter 11B" may be applied to a gate terminal of the NMOS transistor MN37, and a drain terminal of the NMOS transistor MN31 of the first level shifter 11B" may be applied to a gate terminal of the NMOS transistor MN38.

For example, the positive first-power supply voltage DVDD may be set to about 1.8V, and the negative second-power supply voltage AVDDN may be set to about −5.5V.

A detailed configuration of the negative-level shifting circuit 10B" will now be described.

To begin with, a detailed configuration of the first level shifter 11B" will be described.

In the input circuit 11B"-1, the positive first-power supply voltage DVDD may be applied to a source terminal of the PMOS transistor MP31, the input signal IN may be applied to the gate terminal of the PMOS transistor MP31, and a drain terminal of the PMOS transistor MP31 may be connected to an eleventh node ND11. The positive first-power supply voltage DVDD may be applied to a source terminal of the PMOS transistor MP32, the inverted input signal INb may be applied to the gate terminal of the PMOS transistor MP32, and a drain terminal of the PMOS transistor MP32 may be connected to a twelfth node ND12.

In the shielding circuit 11B"-3, a source terminal of the PMOS transistor MP33 may be connected to the eleventh node ND11, the voltage GND of about 0V may be applied to the gate terminal of the PMOS transistor MP33, and a drain terminal of the PMOS transistor MP33 may be connected to a thirteen node ND13. A source terminal of the PMOS transistor MP34 may be connected to the twelfth node ND12, the voltage GND of about 0V may be applied to the gate terminal of the PMOS transistor MP34, and a drain terminal of the PMOS transistor MP34 may be connected to a fourteen node ND14. A drain terminal of the NMOS transistor MN35 may be connected to the thirteen node ND13, the voltage GND of about 0V may be applied to the gate terminal of the NMOS transistor MN35, and a source terminal of the NMOS transistor MN35 may be connected to a fifteenth node ND5. A drain terminal of the NMOS transistor MN36 may be connected to the fourteen node ND14, the voltage GND of about 0V may be applied to the gate terminal of the NMOS transistor MN36, and a source terminal of the NMOS transistor MN36 may be connected to a sixteenth node ND16.

In the load circuit 11B"-2, a drain terminal and a gate terminal of the NMOS transistor MN33 may be connected to the fifteenth node ND15, and a source terminal of the NMOS transistor MN33 may be connected to a seventeenth node ND17. A drain terminal and a gate terminal of the NMOS transistor MN34 may be connected to the sixteenth node ND16, and a source terminal of the NMOS transistor MN34 may be connected to an eighteenth node ND18. The drain terminal of the NMOS transistor MN31 may be connected to the seventh node ND17, a gate terminal of the NMOS transistor MN31 may be connected to the sixteenth node ND16, and the negative second-power supply voltage AVDDN may be applied to a source terminal of the NMOS transistor MN31. A drain terminal of the NMOS transistor MN32 may be connected to the eighteenth node ND18, a gate terminal of the NMOS transistor MN32 may be connected to the fifteenth node ND15, and the negative second-power supply voltage AVDDN may be applied to a source terminal of the NMOS transistor MN32.

The positive first-power supply voltage DVDD may be applied to a body of each of the four PMOS transistors MP31 to MP34, and the negative second-power supply voltage AVDDN may be applied to a body of each of the six NMOS transistors MN31 to MN36.

The PMOS transistors MP33 and MP34 of the shielding circuit 11B'-3 may prevent the negative second-power supply voltage AVDDN from being applied to the first node ND11 and the second node ND12, respectively. Each of the NMOS transistors MN35 and MN36 of the shielding circuit 11B'-3 may be a shielding transistor such that each of the gate terminals of the NMOS transistors MN31 to MN34 is maintained at voltage of (GND−Vthn). Here, Vthn refers to a threshold voltage of the NMOS transistor MN35 or MN36.

Next, a detailed configuration of the second level shifter 12B" will be described.

The voltage GND of about 0V may be applied to a source terminal of the PMOS transistor MP35, a gate terminal of the PMOS transistor MP35 may be connected to a twentieth node ND20, and a drain terminal of the PMOS transistor MP35 may be connected to a nineteenth node ND19. The voltage GND of about 0V may be applied to a source terminal of the PMOS transistor MP36, a gate terminal of the PMOS transistor MP36 may be connected to the nineteenth node ND19, and a drain terminal of the PMOS transistor MP36 may be connected to the twentieth node ND20. A drain terminal of the NMOS transistor MN37 may be connected to the nineteenth node ND19, and the gate terminal of the NMOS transistor MN37 may be connected to the sixteenth node ND16 of the first level shifter 11B". In addition, the negative second-power supply voltage AVDDN may be applied to a source terminal of the NMOS transistor MN37. A drain terminal of the NMOS transistor MN38 may be connected to the twentieth node ND20, and the gate terminal of the NMOS transistor MN38 may be connected to the seventh node ND17 of the first level shifter 11B". In addition, the negative second-power supply voltage AVDDN may be applied to a source terminal of the NMOS transistor MN38.

The voltage GND of about 0V may be applied to bodies of the two PMOS transistors MP35 and MP36, and the negative second-power supply voltage AVDDN may be applied to bodies of the two NMOS transistors MN37 and MN38.

Therefore, operations of the negative-level shifting circuit 10B" shown in FIG. 11 will be described on the assumption that the positive first-power supply voltage DVDD is about 1.8V and the negative second-power supply voltage AVDDN is about −5.5V.

For example, when the input signal IN is in a high state (1.8V) and the inverted input signal INb is in a low state (0V), the negative-level shifting circuit 10B" will operate as follows.

The PMOS transistor MP31 may be turned off, and the PMOS transistor MP32 may be turned on. Thus, a voltage of the twelfth node ND12 may be about 1.8V. In addition, the PMOS transistor MP34 may be turned on, and a voltage of the fourteen node ND14 may be about 1.8V. In addition, a voltage of the sixteenth node ND16 may be limited to (GND−Vthn36) by the NMOS transistor MN36. A voltage of the eighteenth node ND18 may be {GND−(Vthn36+Vthn34)}. Here, Vthn36 denotes a threshold voltage of the NMOS transistor MN36, and Vthn34 denotes a threshold voltage of the NMOS transistor MN34.

Accordingly, since a voltage of the gate terminal of the NMOS transistor MN31 becomes (GND−Vthn36), the NMOS transistor MN31 may be turned on so that a voltage of the seventh node ND17 may be about −5.5V. In addition, a voltage of the fifteenth node ND15 may be (−5.5V+Vthn33). Vthn33 denotes a threshold voltage of the NMOS transistor MN23.

The NMOS transistor MN32 may be turned off, and a voltage of the eighteenth node ND18 may remain {GND−(Vthn36+Vthn34)}. In addition, the NMOS transistor MN35 may be turned on, and a voltage of the thirteen node ND13 may be about −5.5V. A voltage of the eleventh node ND11 may be limited to (GND+Vthp33) by the PMOS transistor MP33. Here, Vthp33 denotes a threshold voltage of the PMOS transistor MP33. Accordingly, the PMOS transistor MP33 may prevent application of a voltage of about −5.5 V to the eleventh node ND11.

Since the gate terminal of the NMOS transistor MN37 is connected to the sixteenth node ND16 and the gate terminal of the NMOS transistor MN38 is connected to the fifteen node ND15, a voltage of the gate terminal of the NMOS transistor MN37 may be (GND−Vthn36), and a voltage of the gate terminal of the NMOS transistor MN38 may be about −5.5V.

Thus, the NMOS transistor MN37 may be turned on, and the NMOS transistor MN38 may be turned off. Thus, a voltage of the nineteenth node ND19 may be about −5.5V, and a voltage of the twentieth node ND20 may be about 0V.

Since the twentieth node ND20 may be set as an output terminal OUT and the nineteenth node ND19 is set as an inverted output terminal OUTb', a voltage of the output terminal OUT may be about 0V, and a voltage of the inverted output terminal OUTb may be about −5.5V.

Accordingly, the negative-level shifting circuit 10B" may receive a logic signal having a low voltage of about 0V and a high voltage of about 1.8V, and a signal having a low voltage of about −5.5V and a high voltage which is level shifted to about 0V.

As shown in FIG. 11, since each of the gate terminals of the four transistors MP33, MP34, MN35, and MN36 that constitute the shielding circuit 11B"-3 has a voltage of about 0V, a gate-body voltage, a gate-source voltage, and a gate-drain voltage may be within an allowable limit of medium-voltage-standards.

Figure 12:
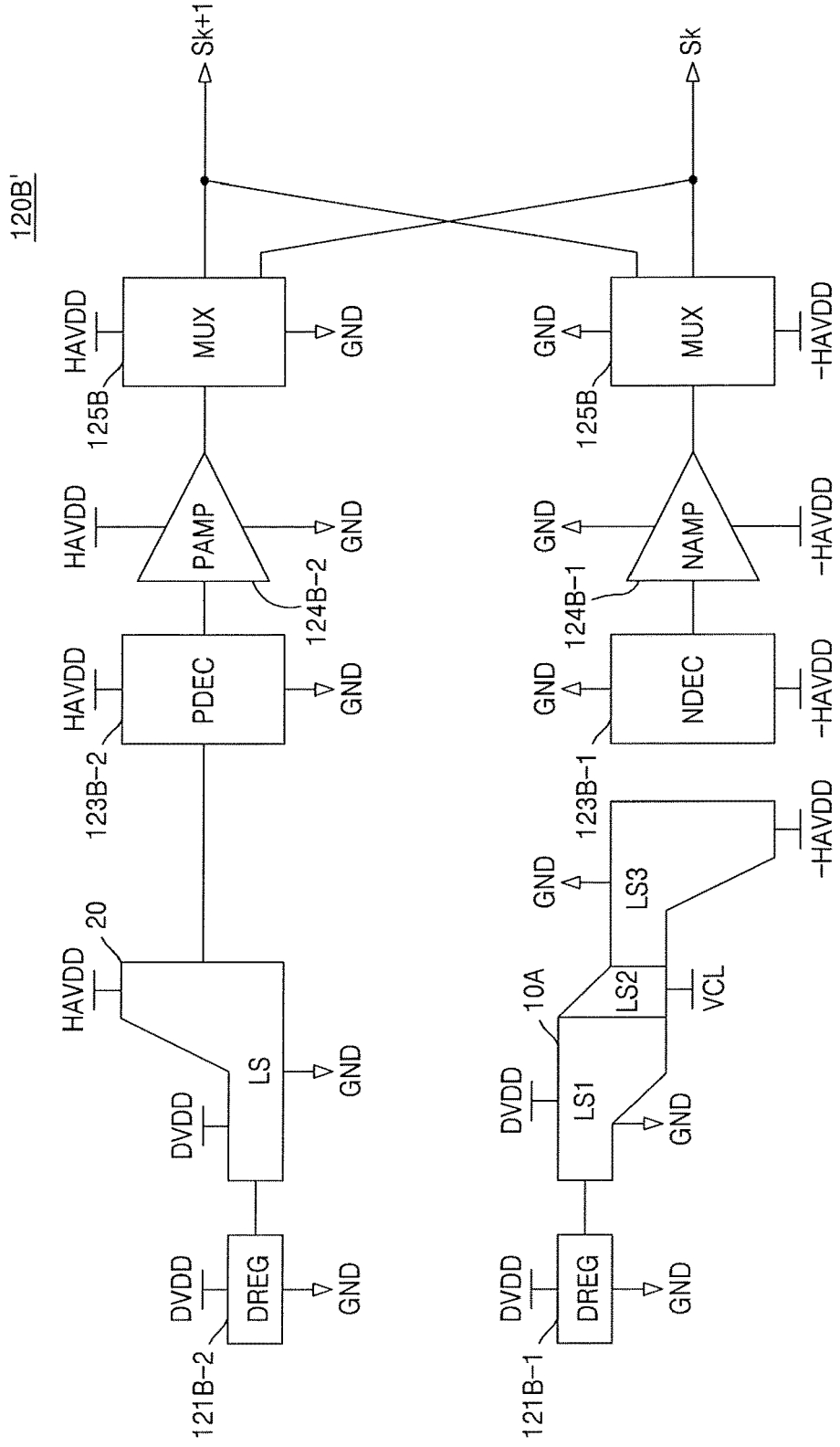
FIG. 12 is a diagram showing a variation in a driving voltage based on a ZERO-VCOM driving method in a source driver to which a negative-level shifting circuit using an additional power source according to an exemplary embodiment of the inventive concept is applied.

FIG. 12 is a diagram showing a variation in driving voltage based on a ZERO-VCOM driving method in a source driver 120B' to which a negative-level shifting circuit 10A using an additional power source according to an exemplary embodiment of the inventive concept is applied.

Power supply voltages applied to the source driver 120B' of FIG. 12 may be a positive first-power supply voltage DVDD, a negative second-power supply voltage AVDDN, and a negative third-power supply voltage VCL. For example, the negative second-power supply voltage AVDDN may be set as −HAVDD. Here, −HAVDD denotes a voltage corresponding to ½ a negative analog driving voltage AVDD.

Referring to FIG. 12, a low voltage may be applied to circuit devices of first and second data registers 121B-1 and 121B-2. In addition, a middle voltage may be applied to a negative level shifter 10A, a negative decoding circuit 123B-1, a negative amplifier circuit 124B-1, a positive level shifter 20, a positive decoding circuit 123B-2, a positive amplifier circuit 124B-2, and a multiplexer 125B.

Figure 13:
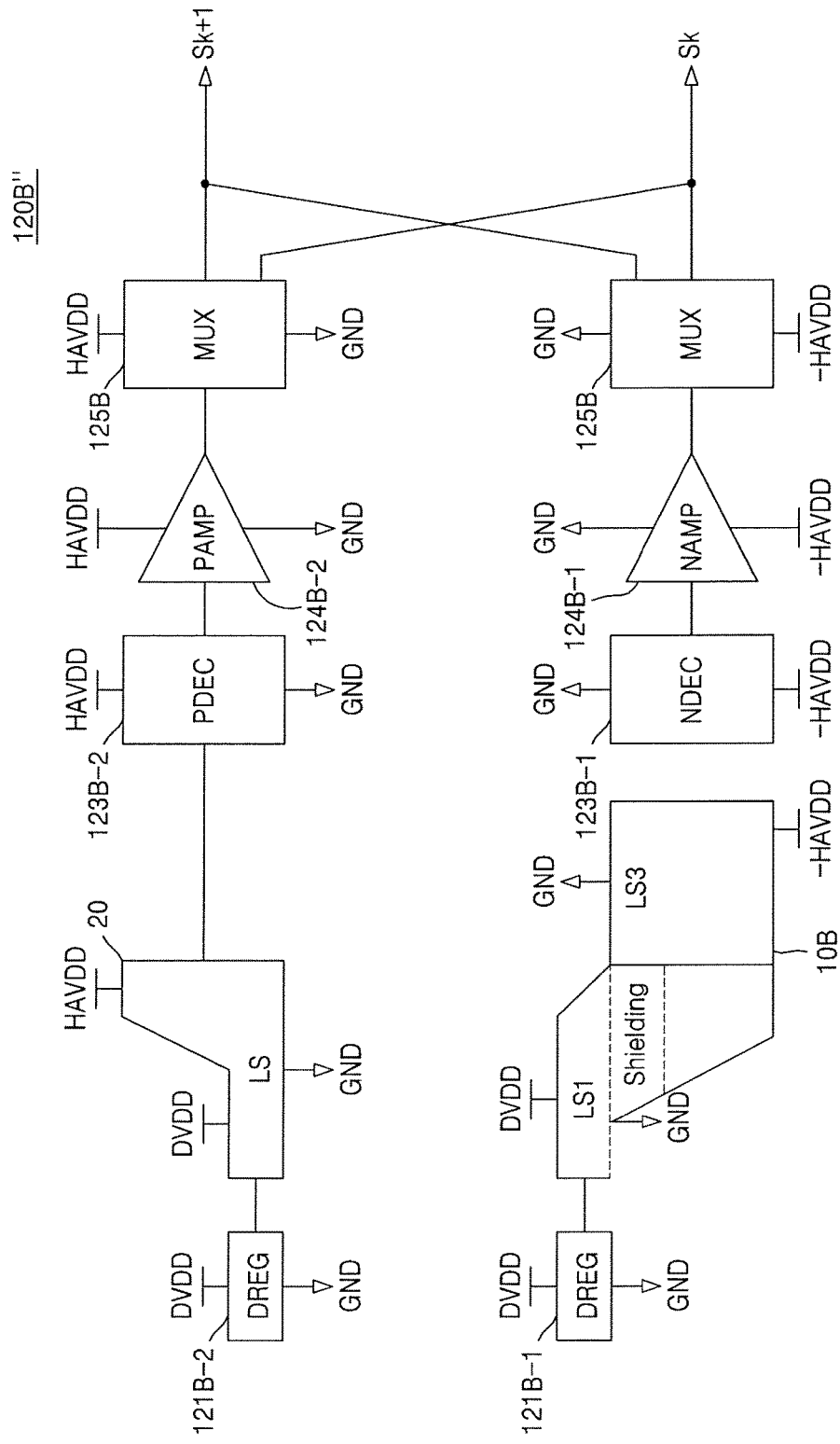
FIG. 13 is a diagram showing a variation in a driving voltage based on a ZERO-VCOM driving method in a source driver to which a negative-level shifting circuit, which does not use an additional power source, according to an exemplary embodiment of the inventive concept, is applied.

FIG. 13 is a diagram showing a variation in driving voltage based on a ZERO-VCOM driving method in a source driver 120B" to which a negative-level shifting circuit 10B' or 10b", which does not use an additional power source, according to an exemplary embodiment of the inventive concept, is applied.

Power supply voltages applied to the source driver 120B" of FIG. 13 may be a positive first-power supply voltage DVDD and a negative second-power supply voltage AVDDN. For example, the negative second-power supply voltage AVDDN may be set as −HAVDD. Here, −HAVDD denotes a voltage corresponding to ½ a negative analog driving voltage AVDD.

Referring to FIG. 13, a low voltage may be applied to circuit devices of first and second data registers 121B-1 and 121B-2. In addition, a middle voltage may be applied to a negative level shifter 10B' or 10B", a negative decoding circuit 123B-1, a negative amplifier circuit 124B-1, a multiplexer 125A, a positive level shifter 20, a positive decoding circuit 123B-2, a positive amplifier circuit 124B-2, and a multiplexer 125B.

Figure 14:
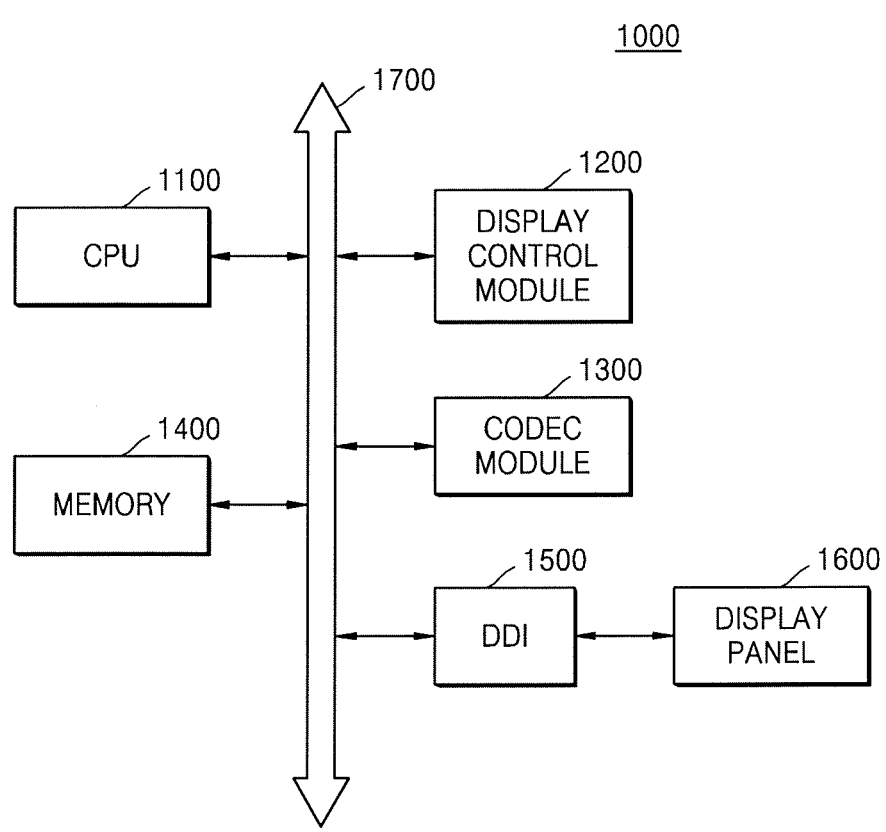
FIG. 14 is a diagram of an electronic device to which a negative-level shifting circuit according to an exemplary embodiment of the inventive concept is applied.

FIG. 14 is a diagram of an electronic device 1000 to which a negative-level shifting circuit according to an exemplary embodiment of the inventive concept is applied.

As shown in FIG. 14, the electronic device 1000 may include a central processing unit (CPU) 1100, a display control module 1200, a codec module 1300, a memory 1400, a display driver integrated circuit (DDI) 1500, a display panel 1600, and a bus 1700.

Various function blocks included in the electronic device 1000 may transmit and receive signals through the bus 1700. FIG. 14 illustrates a case in which the bus 1700 is shared among the various function blocks, but the inventive concept is not limited thereto, and some of the function blocks may transmit and receive signals through an additional signal transmission line.

Although not shown in FIG. 14, the electronic device 1000 may further include various function blocks configured to implement other functions. For example, when the electronic device 1000 implements a communication function, the electronic device 1000 may further include a communication module. In addition, the electronic device 1000 may further include a power management module, a clock module, or a graphic processing unit (GPU). The electronic device 1000 may be embodied by a personal computer (PC), a laptop computer, a mobile device, a personal digital assistant (PDA), or a camera.

The electronic device 1000 shown in FIG. 14 may include any one of the negative-level shifting circuits 10A, 10B, 10B', and 10B" shown in FIGS. 7 through 11.

The display driver integrated circuit 1500 may receive an image signal from the inside or outside of the electronic device 1000, perform a processing operation in response to the image signal, and output a signal (e.g., a gradation voltage) to be displayed on the display panel 1600. For example, the display driver integrated circuit 1500 may include a gate driver configured to drive rows of the display panel 1600 and a source driver configured to drive columns of the display panel 1600. In addition, the display driver integrated circuit 1500 may include a timing controller configured to generate various pieces of timing information for controlling a display operation. The display driver integrated circuit 1500 may include the source driver 120A or 120B shown in FIG. 4 or 5.

The CPU 1100 may control general operations of the electronic device 1000. For example, the CPU 1100 may execute programs and/or data stored in a memory embedded in the CPU 1100 or the memory 1400 disposed outside the CPU 1100. The CPU 1100 may include a multi-core processor, which may be a single computing component including at least two independent and substantial processors.

The display control module 1200 may perform various operations related to the display operation. For example, the display control module 1200 may receive at least one frame data, perform a processing operation corresponding to the at least one frame data, and generate and output a data packet. The display driver integrated circuit 1500 may drive the display panel 1600 based on the data packet output by the display control module 1200.

The codec module 1300 may encode or decode various image signals generated by the electronic device 1000 or externally applied image signals. As an example, the codec module 1300 may encode an image signal and externally apply the encoded image signal. In addition, when the codec module 1300 externally receives an encoded image signal, the codec module 1300 may decode the received encoded image signal so that the display panel 1600 can output an image.

The memory 1400 may store an operating system (OS) and various programs related to an operation of the electronic device 1000, and store an image signal to be output to the display panel 1600. As an example, the memory 1400 may include a storage space capable of storing image data included in at least one frame. The image data may be stored in or read from the memory 1400 in response to data access requests of the various function blocks included in the electronic device 1000.

FIG. 14 illustrates a case in which function blocks for implementing various functions of the mobile device 1000 are separated from one another, but the inventive concept is not limited thereto. Since at least one function block shown in FIG. 14 may process image signals, the at least one function shown in FIG. 14 may be referred to as an image processing device (or image processing system). In addition, the CPU 1100, the display control module 1200, the codec module 1300, other function blocks shown in FIG. 14, and still other function blocks, which are not shown in FIG. 14, may be embodied by System on Chips (SoCs) and integrated in a single semiconductor chip. In addition, the display driver integrated circuit 1500 according to an exemplary embodiment of the inventive concept may be included in an SOC. In addition, a SoC configured to perform an image data processing operation according to an exemplary embodiment of the inventive concept may correspond to an application processor configured to control general functions of the electronic device 1000.

The display control module 1200 and the display driver integrated circuit 1500 may communicate data according to a predetermined protocol. For example, the display control module 1200 and the display driver integrated circuit 1500 may communicate data according to an embedded display port (eDP) standard or other standards, such as a mobile industry processor interface (MIPI) standard.

Figure 15:
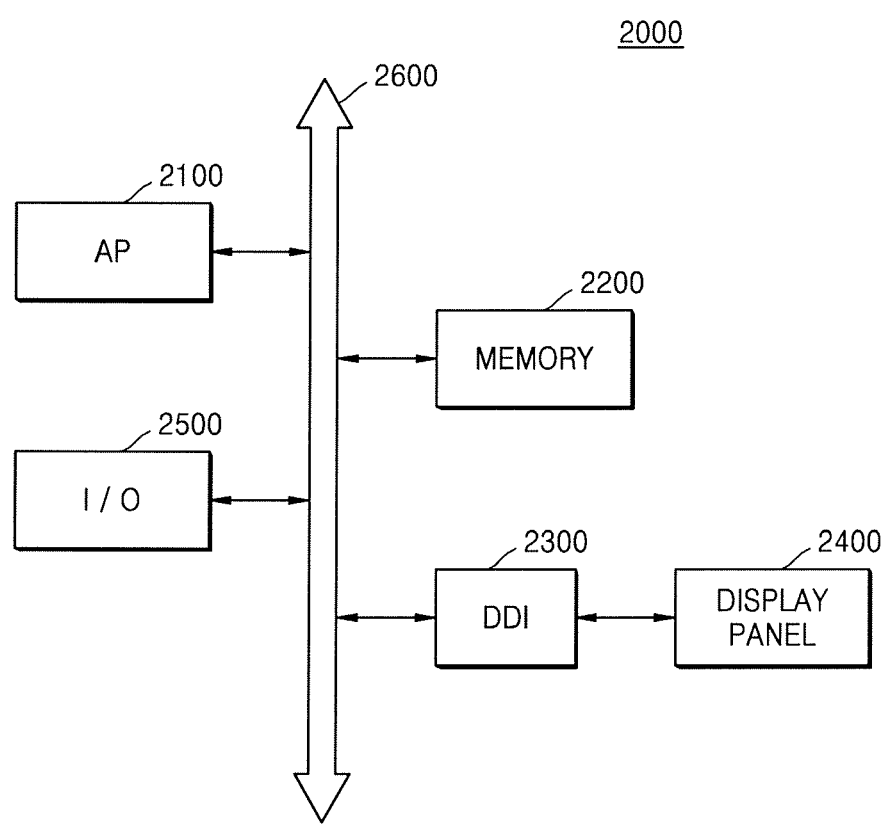
FIG. 15 is a diagram of an electronic device to which a negative-level shifting circuit according to an exemplary embodiment of the inventive concept is applied.

FIG. 15 is a diagram of an electronic device 2000 to which a negative-level shifting circuit according to an exemplary embodiment of the inventive concept is applied.

As shown in FIG. 15, the electronic device 2000 may include an application processor 2100, a memory 2200, a display driver integrated circuit (DDI) 2300, a display panel 2400, an input/output (I/O) device 2500, and a bus 2600.

The electronic device 2000 may be embodied by a PC, a laptop computer, a mobile device, a PDA, or a camera.

Various function blocks included in the electronic device 2000 may transmit and receive signals through the bus 2600. FIG. 15 illustrates a case in which the bus 2600 is shared among the various function blocks, but the inventive concept is not limited thereto, and some of the function blocks may transmit and receive signals through an additional signal transmission line.

The electronic device 2000 shown in FIG. 15 may include any one of the negative-level shifting circuits 10A, 10B, 10B', and 10B" shown in FIGS. 7 through 11.

The memory 2200 may store an OS and various programs related to an operation of the electronic device 2000, and store an image signal to be output to the display panel 2400. As an example, the memory 2200 may include a storage space capable of storing image data included in at least one frame. The image data may be stored in or read from the memory 2200 in response to data access requests of the various function blocks included in the electronic device 2000.

The display driver integrated circuit 2300 may receive an image signal from the inside or outside of the electronic device 2000, perform a processing operation in response to the image signal, and output a signal (e.g., a gradation voltage) to be displayed on the display panel 2400. For example, the display driver integrated circuit 2300 may include a gate driver configured to drive rows of the display panel 2400 and a source driver configured to drive columns of the display panel 2400. In addition, the display driver integrated circuit 2300 may include a timing controller configured to generate various pieces of timing information for controlling a display operation. The display driver integrated circuit 2300 may include the source driver 120A or 120B shown in FIG. 4 or 5.

The application processor 2100 may control general operations of the electronic device 2000. For example, the application processor 2100 may execute programs and/or data stored in a memory embedded in the application processor 2100 or the memory 2200 disposed outside the application processor 2100. The application processor 2100 may include a multi-core processor, which may be a single computing component including at least two independent and substantial processors. The application processor 2100 may include function blocks, such as a display control function block and a codec function block. For example, the application processor 2100 may be embodied by a SoC and integrated in a single semiconductor chip. In addition, the application processor 2100 and the display driver circuit 2300 may be embodied by SoCs and integrated in a single semiconductor chip.

The I/O device 2500 may include an input unit, such as a keyboard, a keypad, or a mouse, and an output unit, such as a printer.

Figure 16:
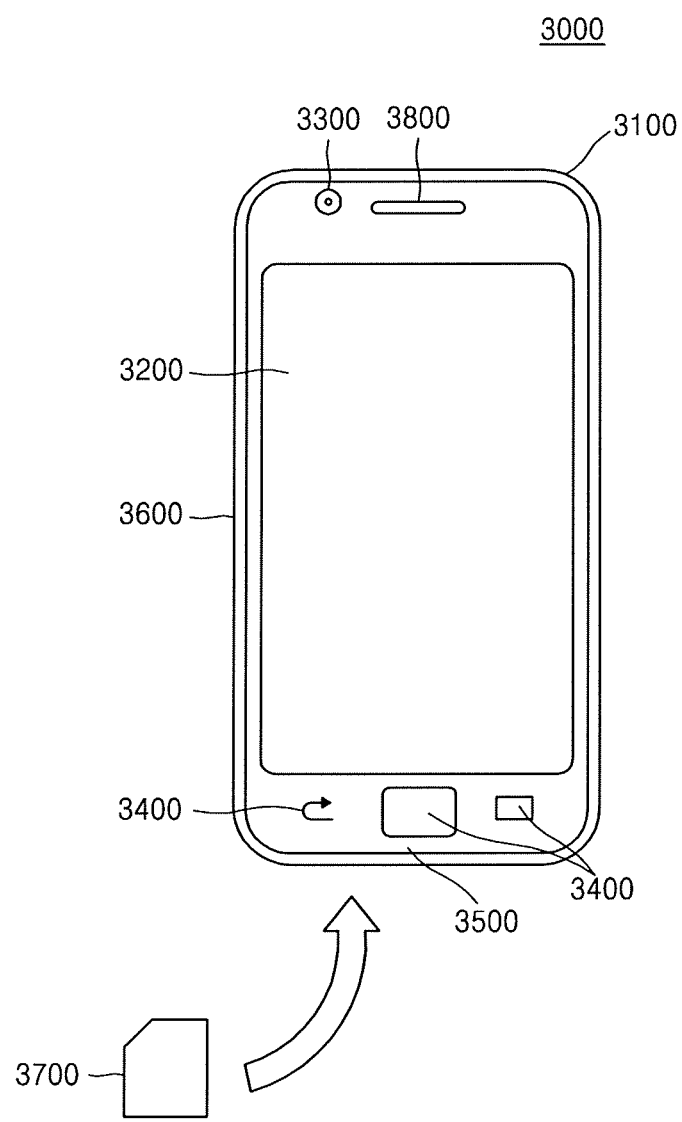
FIG. 16 is a diagram of a mobile device to which a negative-level shifting circuit according to an exemplary embodiment of the inventive concept is applied.

FIG. 16 is a diagram of a mobile terminal 3000 to which a negative-level shifting circuit according to an exemplary embodiment of the inventive concept is applied.

The mobile terminal 3000 shown in FIG. 16 may include any one of the negative-level shifting circuits 10A, 10B, 10B', and 10B'' shown in FIGS. 7 through 11.

An application processor, which is embodied by an SOC, may be disposed in the mobile terminal 3000. The mobile terminal 3000 may be a tablet PC or smartphone of which functions are not limited, but may be changed or expanded via applied programs. The mobile terminal 3000 may include an embedded antenna 3100 and a display device 3200 (e.g., an LCD or an organic light emitting diode (OLED) display) configured to display images captured by a camera 3300 or images received by the antenna 3100. The display device 3200 may include a display panel and a display driver integrated circuit. For example, the display device 3200 may include the source driver 120A or 120B shown in FIG. 4 or 5.

The mobile terminal 3000 may include an operating panel 3400 including a control button and a touch panel. In addition, the mobile terminal 3000 may include a speaker 3800 configured to output voice or sound or a microphone to which voice and sound are input. The mobile terminal 3000 may further include the camera 3300 (e.g., a charge-coupled device (CCD) or a contact image sensor (CIS)) configured to capture video images or still images. In addition, the mobile terminal 3000 may include a storage medium 3700 configured to store encoded or decoded data, for example, video images or still images captured by the camera 3300, received via e-mail, or obtained in a different manner, and a slot 3600 configured to attach the storage medium 3700 to the mobile terminal 3000. The storage medium 3700 may be a secure digital (SD) card or another type of flash memory (e.g., an electrically erasable and programmable read-only memory (EEPROM)) that is embedded in a plastic case.

While the inventive concept has been particularly shown and described with reference to exemplary embodiments thereof, it will be understood that various changes in form and details may be made therein without departing from the spirit and scope of the inventive concept as defined by the following claims.

What is claimed is:
1. A negative-level shifting circuit, comprising:
   a first level shifter including an input circuit configured to receive a logic signal having a first voltage level and a load circuit configured to generate a first output signal having a second voltage level based on a voltage generated by the input circuit; and
   a second level shifter configured to receive the first output signal from the first level shifter and generate a second output signal having a third voltage level, wherein the second level shifter comprises a plurality of transistors, wherein two of the plurality of transistors of the second level shifter receive 0V at their bodies and their source terminals and another two of the plurality of transistors of the second level shifter receive a negative first power supply voltage at their bodies and their source terminals,
   wherein the first level shifter further comprises a shielding circuit connected between the input circuit and the load circuit,
   wherein the shielding circuit comprises a plurality of transistors receiving the voltage of 0V at their gate terminals so that at least one node connected between the shielding circuit and the input circuit has a positive voltage and at least one node connected between the shielding circuit and the load circuit has a negative voltage,
   wherein all the negative first-power supply voltage is applied directly to a body of one of the plurality of transistors of the shielding circuit, and a positive second-power supply voltage is applied directly to a body of another one of the plurality of transistors of the shielding circuit.
2. The circuit of claim 1, wherein the logic signal has a voltage level of about 0V or a positive first voltage.
3. The circuit of claim 2, wherein the positive first voltage has a same level as the positive second-power supply voltage.
4. The circuit of claim 1, wherein the first output signal has a same level as or a lower level than the negative first-power supply voltage, which is applied to the first level shifter and the second level shifter, or has a negative voltage level lower than a voltage of about 0V.
5. The circuit of claim 1, wherein the second output signal has a voltage level of about 0V or a negative second voltage.
6. The circuit of claim 5, wherein the negative second voltage has a same level as the negative first-power supply voltage that is applied to the first level shifter and the second level shifter.
7. The circuit of claim 1, wherein the input circuit comprises;
   a first p-type metal-oxide-semiconductor (PMOS) transistor having a gate terminal connected to an input terminal to which the logic signal is applied, a source terminal to which the positive second-power supply voltage is applied, and a drain terminal connected to a first node; and a second PMOS transistor having a gate terminal connected to an inverted input terminal, a source terminal to which the positive second-power supply voltage is applied, and a drain terminal connected to a second node, wherein each of the first node and the second node is connected to the shielding circuit.

8. The circuit of claim 1, wherein the load circuit comprises:
a first n-type metal-oxide-semiconductor (NMOS) transistor having a gate terminal and a drain terminal connected to a third node and a source terminal connected to a fourth node;
a second NMOS transistor having a gate terminal and a drain terminal connected to a fifth node and a source terminal connected to a sixth node;
a third NMOS transistor having a gate terminal connected to the fifth node, a drain terminal connected to the fourth node, and a source terminal to which the negative first-power supply voltage is applied; and
a fourth NMOS transistor having a gate terminal connected to the third node, a drain terminal connected to the sixth node, and a source terminal to which the negative first-power supply voltage is applied,
wherein each of the third node and the fifth node is connected to the shielding circuit.

9. The circuit of claim 1, wherein the plurality of transistors of the shielding circuit comprise:
a third p-type metal-oxide-semiconductor (PMOS) transistor having a gate terminal connected to the voltage of 0V, a source terminal connected to a first node, and a drain terminal connected to a seventh node;
a fourth PMOS transistor having a gate terminal connected to the voltage of 0V, source terminal connected to a second node, and a drain terminal connected to an eighth node;
a fifth n-type metal-oxide-semiconductor (NMOS) transistor having a gate terminal connected to the voltage of 0V, a drain terminal connected to the seventh node, and a source terminal connected to a third node; and
a sixth NMOS transistor having a gate terminal connected to the voltage of 0V, a drain terminal connected to the eighth node, and a source terminal connected to a fifth node,
wherein each of the first node and the second node is connected to the input circuit, and each of the third node and the fifth node is connected to the load circuit.

10. The circuit of claim 9, wherein the input circuit comprises:
a first PMOS transistor having a gate terminal connected to an input terminal to which the logic signal is applied, a source terminal to which the positive second-power supply voltage is applied, and a drain terminal connected to the first node; and
a second PMOS transistor having a gate terminal connected to an inverted input terminal, a source terminal to which the positive second-power supply voltage is applied, and a drain terminal connected to the second node.

11. The circuit of claim 9, wherein the load circuit comprises:
a first NMOS transistor having a gate terminal and a drain terminal connected to the third node, and a source terminal connected to a fourth node;
a second NMOS transistor having a gate terminal and a drain terminal connected to the fifth node and a source terminal connected to a sixth node;
a third NMOS transistor having a gate terminal connected to the fifth node, a drain terminal connected to the fourth node, and a source terminal to which the negative first-power supply voltage is applied; and
a fourth NMOS transistor having a gate terminal connected to the third node, a drain terminal connected to the sixth node, and a source terminal to which the negative first-power supply voltage is applied.

12. The circuit of claim 1, wherein the plurality of transistors of the second level shifter comprise:
a fifth p-type metal-oxide-semiconductor (PMOS) transistor having a gate terminal connected to an output terminal from which the second output signal is provided, a source terminal connected to the voltage of 0V, and a drain terminal connected to an inverted output terminal;
a sixth PMOS transistor having a gate terminal connected to the inverted output terminal, a source terminal connected to the voltage of 0V, and a drain terminal connected to the output terminal;
a seventh n-type metal-oxide-semiconductor (NMOS) transistor having a gate terminal connected to a first output node of the first level shifter, a drain terminal connected to the inverted output terminal, and a source terminal connected to the negative first-power supply voltage; and
an eighth NMOS transistor having a gate terminal connected to a second output node of the first level shifter, a drain terminal connected to the output terminal, and a source terminal connected to the negative first-power supply voltage.

13. The circuit of claim 12, wherein each of the first output node and the second output node of the first level shifter is connected to the load circuit.

14. The circuit of claim 13, wherein the load circuit comprises:
a first NMOS transistor having a gate terminal and a drain terminal connected to a third node and a source terminal connected to a fourth node;
a second NMOS transistor having a gate terminal and a drain terminal connected to a fifth node and a source terminal connected to a sixth node;
a third NMOS transistor having a gate terminal connected to the fifth node, a drain terminal connected to the fourth node, and a source terminal to which the negative first-power supply voltage is applied; and
a fourth NMOS transistor having a gate terminal connected to the third node, a drain terminal connected to the sixth node, and a source terminal to which the negative first-power supply voltage is applied,
wherein the sixth node is the first output node of the first level shifter, and the fourth node is the second output node of the first level shifter.

15. The circuit of claim 13, wherein the load circuit comprises:
a first NMOS transistor having a gate terminal and a drain terminal connected to a third node and a. source terminal connected to a fourth node;
a second NMOS transistor having a gate terminal and a drain terminal connected to a fifth node and a source terminal connected to a sixth node;
a third NMOS transistor having a gate terminal connected to the fifth node, a drain terminal connected to the fourth node, and a source terminal to which the negative first-power supply voltage is applied; and
a fourth NMOS transistor having a gate terminal connected to the third node, a drain terminal connected to the sixth node, and a source terminal to which the negative first-power supply voltage is applied, wherein the fifth node is the first output node of the first level shifter, and the fourth node is the second output node of the first level shifter.

16. The circuit of claim 1, wherein the negative voltage of the at least one node connected between the shielding circuit and the load circuit is 0V minus a threshold voltage of the transistor of the shielding circuit to which the negative first-power supply voltage is applied and the positive voltage of the at least one node connected between the shielding circuit and the input circuit is 0V plus a threshold voltage of the transistor of the shielding circuit to which the positive second-power supply voltage is applied.

17. A source driver, comprising:
a data register circuit configured to store a digital image signal;
a level shifting circuit configured to shift a voltage level of the digital image signal output by the data register circuit;
a decoding circuit configured to generate an analog gradation voltage signal corresponding to the digital image signal which is level shifted; and
an amplifier circuit configured to amplify the analog gradation voltage signal,
wherein the level shifting circuit comprises:
a first level shifter including an input circuit configured to receive the digital image signal having a first voltage level and a load circuit configured to generate a first output signal having a second voltage level based on a voltage generated by the input circuit; and
a second level shifter configured to receive the first output signal front the first level shifter and generate a second output signal having a third voltage level,
wherein the first level shifter further comprises a shielding circuit connected between the input circuit and the load circuit,
wherein the shielding circuit comprises a plurality of transistors receiving 0V at their gate terminals so that at least one node connected between the shielding circuit and the input circuit has a positive voltage and at least one node connected between the shielding circuit and the load circuit has a negative voltage,
wherein a negative first-power supply voltage is applied directly to a body of a first transistor of the plurality of transistors of the shielding circuit, and a positive second-power supply voltage is applied directly to a body of a second transistor of the plurality of transistors of the shielding circuit,
wherein the second level shifter further comprises a plurality of transistors, wherein first and second transistors of the plurality of transistors of the second level shifter receive the voltage of 0V at their bodies and their source terminals and third and fourth transistors of the plurality of transistors of the second level shifter receive the negative first-power supply voltage at their bodies and their source terminals.

* * * * *